(12) United States Patent
Zhang

(10) Patent No.: US 12,424,546 B2
(45) Date of Patent: Sep. 23, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Kui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 406 days.

(21) Appl. No.: 18/176,652

(22) Filed: Mar. 1, 2023

(65) Prior Publication Data

US 2023/0207463 A1  Jun. 29, 2023

Related U.S. Application Data

(63) Continuation of application No. PCT/CN2021/121375, filed on Sep. 28, 2021.

(30) Foreign Application Priority Data

Mar. 29, 2021  (CN) .......................... 202110336389.7

(51) Int. Cl.
*H01L 23/528* (2006.01)
*H01L 23/522* (2006.01)

(52) U.S. Cl.
CPC ...... *H01L 23/5283* (2013.01); *H01L 23/5226* (2013.01)

(58) Field of Classification Search
CPC .. H10D 84/85; H10D 62/121; H10D 30/6757; H01L 23/5286; H01L 23/5226;
(Continued)

(56) References Cited

U.S. PATENT DOCUMENTS 5,612,563 A * 3/1997 Fitch ................. H10D 30/0321
257/E29.267
7,244,643 B2  7/2007 Ishitsuka
(Continued)

FOREIGN PATENT DOCUMENTS

CN  1592969 A  3/2005
CN  101090121 A  12/2007
(Continued)

OTHER PUBLICATIONS

Will CFET be the transistor of choice of the future, Semiconductor Industry Watch, May 28, 2020, http://news.moore.ren/industry/225676.htm, 10 pages.
(Continued)

*Primary Examiner* — Zandra V Smith
*Assistant Examiner* — John M Parker
(74) *Attorney, Agent, or Firm* — SYNCODA LLC; Feng Ma

(57) ABSTRACT

A semiconductor structure includes: a base; a first conductive path including a first channel area and a first doped area and a second doped area located on two opposite ends of the first channel area; a first electrical connection structure located in the base and in contact with first doped area; a second electrical connection structure in contact with second doped area; a second conductive path including a second channel area and a third doped area and a fourth doped area located on two opposite ends of the second channel area, the third doped area being in contact with the side of the second electrical connection structure away from the base, and orthographic projection of the second conductive path on the base being at least partially non-overlapping with orthographic projection of the first conductive path on the base; and a gate structure surrounding first channel area and second channel area.

19 Claims, 22 Drawing Sheets

(58) Field of Classification Search
CPC ............... H01L 23/535; H01L 23/481; H01L 21/76895; H01L 21/76897; H01L 21/02603

See application file for complete search history.

(56) References Cited

U.S. PATENT DOCUMENTS

| | | | |
|---|---|---|---|
| 7,723,807 B2 | 5/2010 | Nishiyama | |
| 7,906,435 B2 | 3/2011 | Nishiyama | |
| 8,036,036 B2 | 10/2011 | Nishiyama | |
| 8,878,279 B2 | 11/2014 | Koval | |
| 9,196,625 B2 | 11/2015 | Koval | |
| 9,443,864 B2 | 9/2016 | Koval | |
| 9,472,551 B2 | 10/2016 | Oxland | |
| 9,698,022 B2 | 7/2017 | Koval | |
| 9,831,131 B1 | 11/2017 | Jacob | |
| 9,953,882 B2 | 4/2018 | Jacob | |
| 9,997,463 B2 | 6/2018 | Zhang | |
| 10,049,946 B2 | 8/2018 | Oxland | |
| 10,115,438 B2 | 10/2018 | Ingalls | |
| 10,115,641 B2 | 10/2018 | Zhu | |
| 10,339,985 B2 | 7/2019 | Ingalls | |
| 10,580,464 B2 | 3/2020 | Ingalls | |
| 10,629,538 B2 | 4/2020 | Zhang | |
| 10,944,012 B2 | 3/2021 | Reznicek | |
| 11,081,484 B2 | 8/2021 | Zhu | |
| 11,081,546 B2 | 8/2021 | Li | |
| 2003/0136978 A1 | 7/2003 | Takaura | |
| 2005/0121727 A1 | 6/2005 | Ishitsuka | |
| 2007/0290232 A1 | 12/2007 | Nishiyama | |
| 2010/0027338 A1 | 2/2010 | Nishiyama | |
| 2010/0052055 A1 | 3/2010 | Takeuchi | |
| 2010/0203728 A1 | 8/2010 | Nishiyama | |
| 2012/0175626 A1 | 7/2012 | Erickson | |
| 2014/0160841 A1 | 6/2014 | Koval | |
| 2014/0332860 A1 | 11/2014 | Guo et al. | |
| 2015/0187785 A1 | 7/2015 | Koval | |
| 2015/0364486 A1 | 12/2015 | Koval | |
| 2016/0063163 A1 | 3/2016 | Moroz et al. | |
| 2016/0240533 A1 | 8/2016 | Oxland | |
| 2017/0005106 A1 | 1/2017 | Zhang | |
| 2017/0011928 A1 | 1/2017 | Koval | |
| 2017/0033021 A1* | 2/2017 | Oxland | H01L 21/0262 |
| 2018/0061460 A1 | 3/2018 | Ingalls et al. | |
| 2018/0090387 A1* | 3/2018 | Jacob | H10D 30/025 |
| 2018/0096896 A1 | 4/2018 | Zhu | |
| 2018/0097065 A1 | 4/2018 | Zhu | |
| 2018/0097106 A1 | 4/2018 | Zhu | |
| 2018/0108577 A1 | 4/2018 | Zhu et al. | |
| 2018/0294015 A1 | 10/2018 | Ingalls et al. | |
| 2018/0337133 A1 | 11/2018 | Zhang | |
| 2019/0206736 A1* | 7/2019 | Sills | H01L 23/5226 |
| 2019/0287579 A1 | 9/2019 | Ingalls et al. | |
| 2019/0287865 A1 | 9/2019 | Zhu et al. | |
| 2019/0378854 A1 | 12/2019 | Lee et al. | |
| 2020/0203343 A1 | 6/2020 | Zhu et al. | |
| 2020/0211905 A1 | 7/2020 | Huang et al. | |
| 2020/0212226 A1 | 7/2020 | Reznicek et al. | |
| 2020/0273755 A1 | 8/2020 | Wu et al. | |
| 2020/0280700 A1 | 9/2020 | Zhu | |
| 2020/0335581 A1 | 10/2020 | Li et al. | |
| 2020/0343241 A1 | 10/2020 | Wu et al. | |
| 2020/0350326 A1 | 11/2020 | Yun et al. | |
| 2020/0381433 A1* | 12/2020 | Cai | H10D 84/85 |
| 2021/0036146 A1 | 2/2021 | Zhou | |
| 2021/0296316 A1 | 9/2021 | Zhu | |
| 2021/0305364 A1 | 9/2021 | Li et al. | |
| 2022/0102492 A1* | 3/2022 | Gardner | H10D 84/0177 |

FOREIGN PATENT DOCUMENTS

| | | |
|---|---|---|
| CN | 101667583 A | 3/2010 |
| CN | 101728431 A | 6/2010 |
| CN | 105895635 A | 8/2016 |
| CN | 106252352 A | 12/2016 |
| CN | 106298792 A | 1/2017 |
| CN | 106449596 A | 2/2017 |
| CN | 109196584 A | 1/2019 |
| CN | 109449158 A | 3/2019 |
| CN | 109830483 A | 5/2019 |
| CN | 109841675 A | 6/2019 |
| CN | 110808247 A | 2/2020 |
| CN | 111211170 A | 5/2020 |
| CN | 111384048 A | 7/2020 |
| CN | 111883534 A | 11/2020 |
| CN | 112309860 A | 2/2021 |
| CN | 112310042 A | 2/2021 |
| CN | 113078154 A | 7/2021 |
| CN | 113078155 A | 7/2021 |
| CN | 113078156 A | 7/2021 |
| JP | 2007059680 A | 3/2007 |
| JP | 2007250652 A | 9/2007 |
| TW | 201631506 A | 9/2016 |

OTHER PUBLICATIONS

International Search Report in the international application No. PCT/CN2021/111900, mailed on Dec. 30, 2021, 2 pages.
International Search Report in the international application No. PCT/CN2021/112012, mailed on Dec. 30, 2021, 2 pages.
International Search Report in the international application No. PCT/CN2021/121375, mailed on Jan. 7, 2022, 3 pages.
International Search Report in the international application No. PCT/CN2021/112900, mailed on Jan. 6, 2022, 2 pages.
International Search Report in the international application No. PCT/CN2021/110887, mailed on Jan. 5, 2022, 2 pages.
Notice of Allowance of the Chinese application No. 202110336389.7, issued on May 18, 2022, 5 pages.
Notice of Allowance of the Chinese application No. 202110334233.5, issued on Mar. 14, 2022, 6 pages.
Notice of Allowance of the Chinese application No. 202110332468.0, issued on May 19, 2022, 6 pages.

* cited by examiner

SEMICONDUCTOR STRUCTURE AND METHOD FOR FORMING SAME

CROSS-REFERENCE TO RELATED APPLICATIONS

The disclosure is a continuation application of International Patent Application No. PCT/CN2021/121375, filed on Sep. 28, 2021, which claims priority to China Patent Application No. 202110336389.7, filed on Mar. 29, 2021. The disclosures of International Patent Application No. PCT/CN2021/121375 and China Patent Application No. 202110336389.7 are hereby incorporated by reference in their entireties.

BACKGROUND

The performance and preparation process of integrated circuit chips are closely related to transistor device structures. The level of integration of integrated circuits tends to be higher, one or more pairs of nFET and pFET cylindrical nanowires or nanosheets are stacked onto one another in a vertical crossing manner to form a Gate All Around (GAA) cylindrical nanowire or nanosheet Complementary Field Effect Transistor (CFET) device structure. In the CFET device structure, nFET and pFET share a gate electrode as a signal input end and share a drain electrode as a signal output end, and source electrodes thereof are grounded and connected to a power supply, respectively. Device dimensions may be flexibly adjusted to meet performance requirements for different chips. The electrical integrity of the GAA field effect transistor formed by the 10 nanowires or nanosheets stacked onto one another in a vertical manner is maintained. In addition, the chip area is greatly saved, the drive current of devices is enhanced, and the level of integration of chip devices is improved.

However, pFET and nFET share a source or drain connection line, the preparation process of the connection line is complicated and difficult to control, the current nFET and pFET both use horizontally arranged GAA transistors, and horizontally arranged conductive channel areas occupy a large area in a horizontal direction, which limits the development of a CFET towards higher level of integration.

SUMMARY

Embodiments of the disclosure relate to the field of semiconductors, and more particularly, to a semiconductor structure and a method for forming a semiconductor structure.

Embodiments of the disclosure provide a semiconductor structure and a method for forming a semiconductor structure.

The embodiments of the disclosure provide a semiconductor structure, including: a base and at least one first conductive path located on the base, where the at least one first conductive path includes, in a direction perpendicular to a surface of the base, a first channel area, a first doped area and a second doped area, where the first doped area is located at one end of the first channel area, and the second doped area is located at another end of the first channel area opposite to said one end; a first electrical connection structure located in the base, where the first electrical connection structure is in contact with the first doped area; a second electrical connection structure, where the second electrical connection structure is in contact with the second doped area, and a plane where the second electrical connection structure is located is parallel to a plane where the first electrical connection structure is located; at least one second conductive path, where the at least one second conductive path includes, in the direction perpendicular to the surface of the base, a second channel area, a third doped area and a fourth doped area, the third doped area is located at one end of the second channel area, and the fourth doped area is located at another end of the second channel area opposite to said one end, the third doped area is in contact with a side of the second electrical connection structure away from the base, and one of an orthographic projection of the at least one second conductive path on the base and an orthographic projection of the at least one first conductive path on the base includes an area which at least does not partially overlap with another of the orthographic projection of the at least one second conductive path on the base and the orthographic projection of the at least one first conductive path on the base; and a gate structure surrounding the first channel area and the second channel area.

The embodiments of the disclosure also provide a method for forming a semiconductor structure, including the following operations. A base is provided, the base including a substrate, a first electrical connection structure and a first isolation layer. A first sacrificial layer is formed on the base. The first sacrificial layer and the first isolation layer are patterned to form a first via penetrating through the first sacrificial layer and the first isolation layer. A first conductive path filling the first via and a second electrical connection structure located on a side of the first conductive path away from the base are formed. A second sacrificial layer and a protective layer on a side of the second electrical connection structure away from the base are successively formed. The protective layer and the second sacrificial layer are patterned to form a second via penetrating through the protective layer and the second sacrificial layer, where one of an orthographic projection of the first via on the base and an orthographic projection of the second via on the base includes an area which at least does not partially overlap with another of the orthographic projection of the first via on the base and the orthographic projection of the second via on the base. A second conductive path filling the second via is formed. The protective layer is patterned to form a third via until the first sacrificial layer is exposed, and the second sacrificial layer and the first sacrificial layer are removed. A gate structure filling gaps is formed.

BRIEF DESCRIPTION OF THE DRAWINGS

One or more embodiments are exemplified by the pictures in the corresponding accompanying drawings, and the figures in the drawings do not constitute a proportional limitation, unless otherwise stated.

DETAILED DESCRIPTION

It can be seen from the background art that in a related CFET device structure, horizontally arranged conductive channel areas occupy a large area in a horizontal direction, which limits the development of a CFET towards higher level of integration.

The embodiments of the disclosure provide a semiconductor structure and a method for forming a semiconductor structure. In the semiconductor structure, a first channel area and a second channel area misalign with each other and are stacked onto one another in a direction perpendicular to a surface of a base, which at least facilitates saving layout space of the first conductive path and the second conductive path in a direction parallel to the surface of the base while further increasing the length of the first channel area and the length of the second channel area. In addition, one of an orthographic projection of the second conductive path on the base and an orthographic projection of the first conductive path on the base includes an area which at least does not partially overlap with another of the orthographic projection of the second conductive path on the base and the orthographic projection of the first conductive path on the base, which at least facilitates reducing or eliminating a facing area between the first conductive path and the second conductive path, thereby reducing electrical interference between the first conductive path and the second conductive path.

For purposes of clarity of the objects, technical solutions and advantages of the embodiments of the disclosure, the embodiments of the disclosure are described below in combination with the accompanying drawings. However, it will be appreciated by those ordinarily skilled in the art that in the various embodiments of the disclosure, numerous specific details are set forth in order to provide a better understanding of the disclosure by the reader. However, the claimed technical solutions of the disclosure may be realized without these technical details and various changes and modifications based on the following embodiments. The following various embodiments are divided for convenience of description and should not be construed as limiting the specific implementations of the disclosure, and the various embodiments may be combined with each other and referred to each other without conflict.

Figure 1:
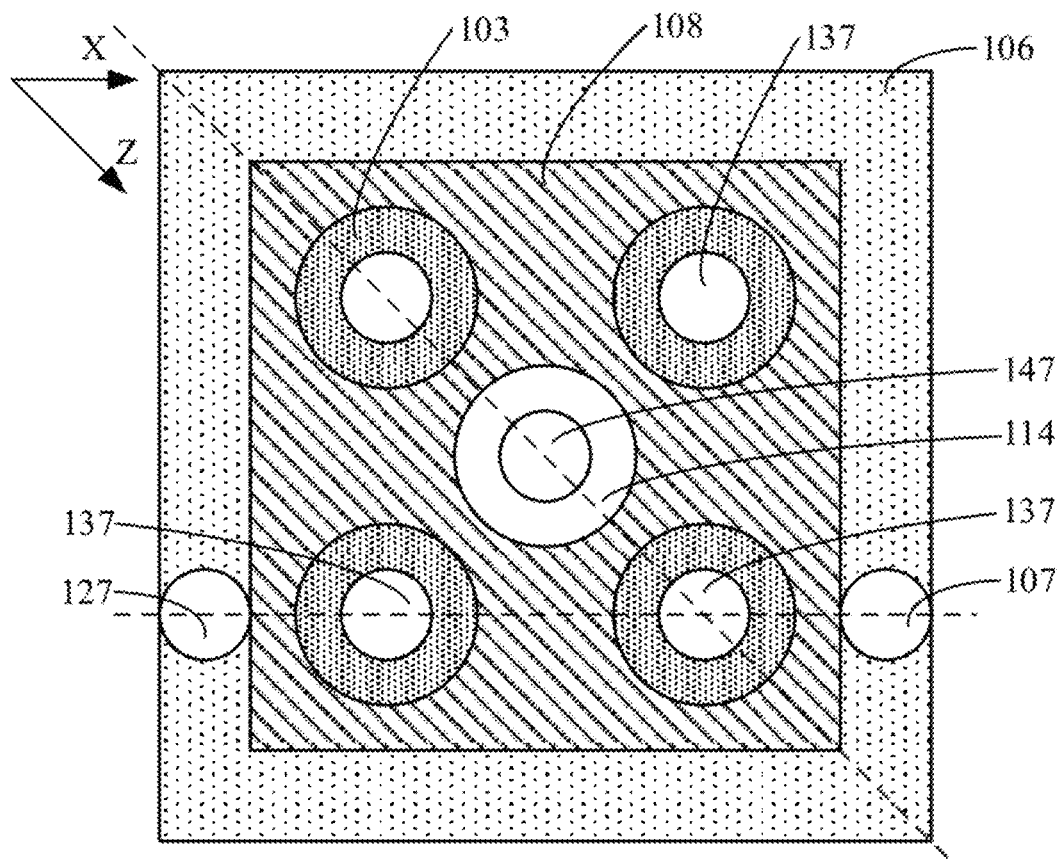
FIG. 1 to FIG. 13 are schematic diagrams of a semiconductor structure according to an embodiment of the disclosure.
Figure 2:
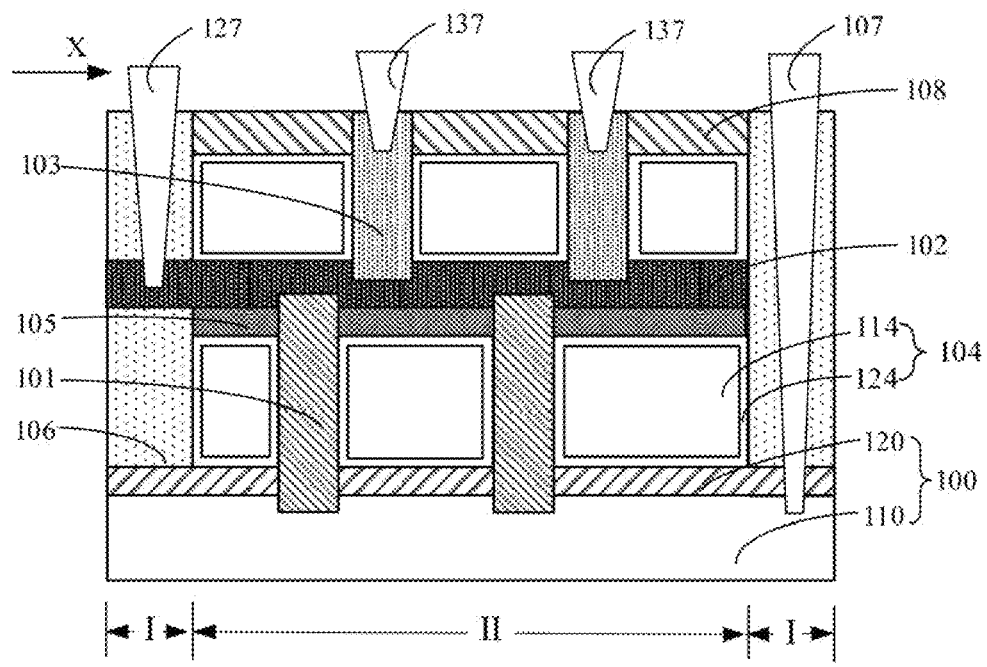
Figure 3:
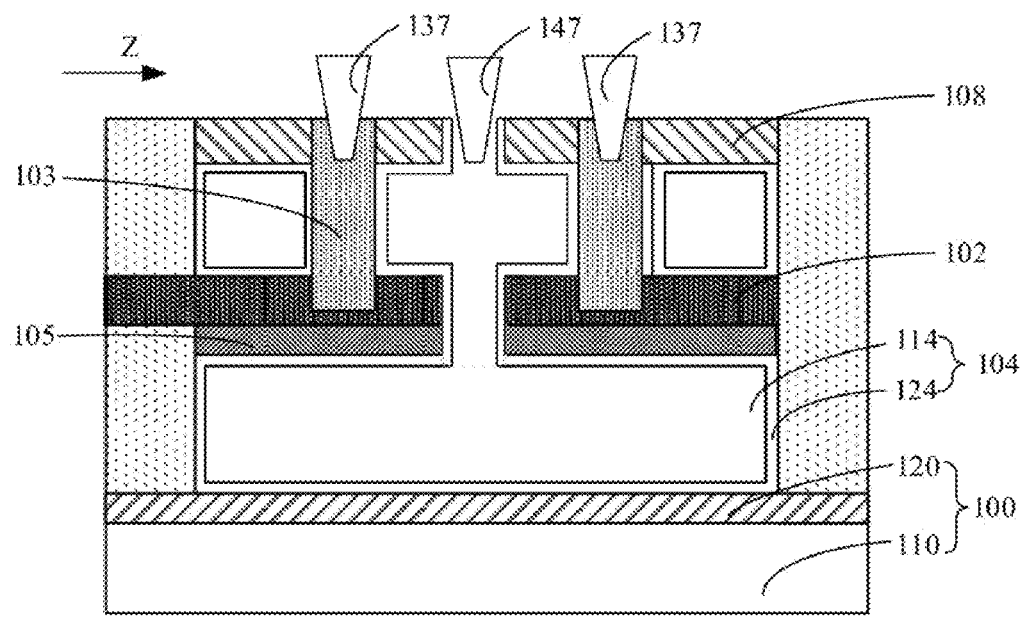

FIG. 1 to FIG. 13 are schematic diagrams of a semiconductor structure according to an embodiment of the disclosure. FIG. 1 is a schematic top view of a semiconductor structure according to an embodiment of the disclosure. FIG. 2 is a schematic transverse cross-sectional view of FIG. 1 taken along an X-direction. FIG. 3 is a schematic oblique cross-sectional view of FIG. 1 taken along a Z-direction.

With reference to FIG. 1 to FIG. 3, in some embodiments, a semiconductor structure includes: a base 100 and a first conductive path 101 located on the base 100; a first electrical connection structure 110; a second electrical connection structure 102; a second conductive path 103; and a gate structure 104. The first conductive path 101 includes, in a direction perpendicular to a surface of the base 100, a first channel area (not identified), a first doped area (not identified) and a second doped area (not identified). The first doped area is located at one end of the first channel area, and the second doped area is located at another end of the first channel area opposite to said one end. The first electrical connection structure 110 is located in the base 100 and in contact with the first doped area. The second electrical connection structure 102 is in contact with the second doped area, and a plane where the second electrical connection structure 102 is located is parallel to a plane where the first electrical connection structure 110 is located. The second conductive path 103 includes, in the direction perpendicular to the surface of the base 100, a second channel area (not identified), a third doped area (not identified) and a fourth doped area (not identified). The third doped area is located at one end of the second channel area, and the fourth doped area is located at another end of the second channel area opposite to said one end. The third doped area is in contact with a side of the second electrical connection structure 102 away from the base 100. The gate structure 104 surrounds the first channel area and the second channel area.

In some embodiments, one of the first conductive path 101 and the second conductive path 103 is an N-type conductive path and the other of the first conductive path 101 and the second conductive path 103 is a P-type conductive path. In some embodiments, an example in which the first conductive path 101 is an N-type conductive path and the second conductive path 103 is a P-type conductive path is described in detail, which does not limit the disclosure. In other embodiments, an example in which the first conductive path is a P-type conductive path and the second conductive path is an N-type conductive path is described in detail.

In this embodiment, both the first conductive path 101 and the second conductive path 103 may be formed by in-situ doping or deposition followed by doping. The material of the first conductive path 101 is an N-type semiconductor material which is formed by doping a group VA element into monocrystalline silicon, and the material of the second conductive path 103 is a P-type semiconductor material which is formed by doping a group IIIA element into monocrystalline silicon.

Specifically, the doping concentration at two ends of the first conductive path 101 is greater than the doping concentration in the middle of the first conductive path 101, thereby forming a first doped area and a second doped area. The doping concentration at two ends of the second conductive path 103 is greater than the doping concentration in the middle of the second conductive path 103, to form a third doped area and a fourth doped area. In the embodiments of the disclosure, an example in which the first doped area is close to the base 100 and the second doped area is close to the second conductive path 103 is described in detail, which does not limit the disclosure. In other embodiments, there is an example in which the second doped area is close to the base and the first doped area is close to the second conductive path. Further, in the embodiments of the disclosure, an example in which the fourth doped area is away from the second electrical connection structure 102 and the third doped area is close to the second electrical connection structure 102 is described in detail, which does not limit the disclosure. In other embodiments, there is an example in which the third doped area is away from the second electrical connection structure and the fourth doped area is close to the second electrical connection structure.

It is to be noted that in some embodiments, there may be one first conductive path 101 on the base 100, or there may be at least two first conductive paths 101 on the base 100. The at least two first conductive paths 101 are arranged on the base 100 and spaced apart from each other, and the second conductive paths 103 are arranged in one-to-one correspondence with the first conductive paths 101. The first electrical connection structure 110 is in contact with each first doped area, and the second electrical connection structure 102 is in contact with each second doped area and each third doped area. With reference to FIG. 1, in this embodiment, an example in which four first conductive paths 101 are located on the base 100 is described in detail, which does not limit the disclosure. In other embodiments, there may be one first conductive path 101, three first conductive paths 101 or five first conductive paths 101, and in specific applications, the number of the first conductive paths 101 may be specifically set according to requirements. In addition, in this embodiment, four first conductive paths 101 are arranged in a quadrangular arrangement, and thus the second conductive paths 103 arranged in one-to-one correspondence with the first conductive paths 101 are also arranged in a quadrangular arrangement.

With continuous reference to FIG. 2, in some embodiments, orthographic projections of the second conductive paths 103 on the base 100 do not overlap with orthographic projections of the first conductive paths 101 on the base 100. Therefore, a facing area is absent between each of the first conductive paths 101 and a respective one of the second conductive paths 103, and then PN junction is absent between the second doped area and the third doped area. When the semiconductor structure is in operation, the second doped area and the third doped area are both connected to the second electrical connection structure 102. Since PN junction is absent between the second doped area and the third doped area, an electrical interference is absent between the second doped area and the third doped area, which facilitates ensuring that the second doped area and the third doped area have the same electrical potential at this moment.

In other embodiments, there are overlapping areas in which the orthographic projections of the second conductive paths on the base partially overlap with the orthographic projections of the first conductive paths on the base. A conductive buffer layer is arranged between the first conductive paths and the second conductive paths for reducing electrical interference between the second doped area and the third doped area, and the overlapping areas are within an orthographic projection of the conductive buffer layer on the base. In one example, the material of the conductive buffer layer is polycrystalline silicon, and the conductive buffer layer prevents the problem of electrical interference between the second doped area and the third doped area by reducing a dielectric constant between the second doped area and the third doped area.

With continuous reference to FIG. 2, in some embodiments, in a direction from the first doped area to the second doped area, a top surface of each of the first conductive paths 101 is located higher than a bottom surface of the second electrical connection structure 102 and located lower than a top surface of the second electrical connection structure 102, and a bottom surface of each of the second conductive paths 103 is located higher than the bottom surface of the second electrical connection structure 102 and located lower than the top surface of the second electrical connection structure 102. Therefore, a part of an end of each of the first conductive paths 101 close to the second electrical connection structure 102 is located in the second electrical connection structure 102, and a part of an end of each of the second conductive paths 103 close to the second electrical connection structure 102 is located in the second electrical connection structure 102, which facilitates ensuring a good electrical connection effect between the top surface of each of the first conductive paths 101 and the second electrical connection structure as well as a good electrical connection effect between the bottom surface of each of the second conductive paths 103 and the second electrical connection structure.

Specifically, in the direction from the first doped area to the second doped area, the thickness of a part of each of the first conductive paths 101 located in the second electrical connection structure 102 is a first thickness, and the thickness of a part of each of the second conductive paths 103 located in the second electrical connection structure 102 is a second thickness. Each of the ratio of the first thickness to the thickness of the second electrical connection structure 102 and the ratio of the second thickness to the thickness of the second electrical connection structure 102 ranges from 1/5 to 4/5. On the one hand, each of the first thickness and the second thickness is greater than 1/5 of the thickness of the second electrical connection structure 102, so that there is a larger contact area between the second electrical connection structure 102 and the second doped area as well as a larger contact area between the second electrical connection structure 102 and the third doped area, thereby ensuring the stability of the electrical connection between the second electrical connection structure 102 and the second doped area as well as the stability of the electrical connection between the second electrical connection structure 102 and the third doped area. On the other hand, each of the first thickness and the second thickness is less than 4/5 of the thickness of the second electrical connection structure 102, to prevent the thickness of a part of the second electrical connection structure 102 located between the second doped area and the gate structure 104 and the thickness of a part of the second electrical connection structure 102 located between the third doped area and the gate structure 104 from being too small, and to prevent electrical interference between the second doped area and the gate structure 104 and electrical interference between the third doped area and the gate structure 104, which affects the electrical performance of the semiconductor structure.

In this embodiment, the material of the first electrical connection structure and the material of the second electrical connection structure are semiconductor conductive materials or metal conductive materials such as tungsten.

With continuous reference to FIG. 2, in some embodiments, in the direction from the first doped area to the second doped area, the base 100 includes: a substrate (not identified) and a first isolation layer 120 successively stacked onto one another. The substrate includes the first electrical connection structure 110. The first isolation layer 120 is located on the top surface of the first electrical connection structure 110, and the first conductive paths 101 penetrate through the first isolation layer 120 such that the first doped area is in contact with the first electrical connection structure 110.

In some embodiments, the first conductive paths 101 also penetrate through at least a portion of the first electrical connection structure 110, and then a part of an end of each of the first conductive paths 101 close to the first electrical connection structure 110 is located in the first electrical connection structure 110, such that there is a larger contact area between the first electrical connection structure 110 and the first doped area, thereby ensuring the stability of electrical connection between the first electrical connection structure 110 and the first doped area. In other embodiments, the first conductive paths may penetrate through only the first isolation layer, such that a bottom surface of each of the first conductive paths is in contact with the first electrical connection structure.

In some embodiments, the material of the substrate includes silicon, silicon carbide, gallium arsenide, aluminum nitride, or zinc oxide, etc. In this embodiment, the substrate is formed of a silicon material. In this embodiment, the silicon material is used as the substrate in order to facilitate those skilled in the art to understand the subsequent formation method, which does not limit the disclosure. In the practical application, a suitable material for the substrate may be selected according to requirements.

In this embodiment, the material of the first isolation layer 120 is at least one of silicon nitride, silicon carbonitride or silicon carbonitride oxide. The first isolation layer 120 is located between the first electrical connection structure 110 and the gate structure 104, which facilitates preventing electrical interference between the first electrical connection structure 110 and the gate structure 104.

Specifically, this embodiment provides four implementations of the first electrical connection structure and the second electrical connection structure, which will be described below in conjunction with FIG. 7 to FIG. 9.

In some embodiments, with continuous reference to FIG. 2 and FIG. 3, the first electrical connection structure 110 is a first conductive layer, the first conductive layer is a full-face continuous film layer, and the first conductive layer is in contact with each first doped area. The second electrical connection structure 102 is a second conductive layer, the second conductive layer is a full-face continuous film layer, and the second conductive layer is in contact with each second doped area and each third doped area. The second conductive layer is provided with a first communication hole penetrating through the second conductive layer, and the first communication hole is filled with the gate structure 104.

Specifically, the second conductive layer is also provided with grooves for accommodating the second doped area and the third doped area. When the semiconductor structure is in operation, the respective first doped areas have the same electric potential, and each second doped area and each third doped area have the same electric potential.

Figure 4:
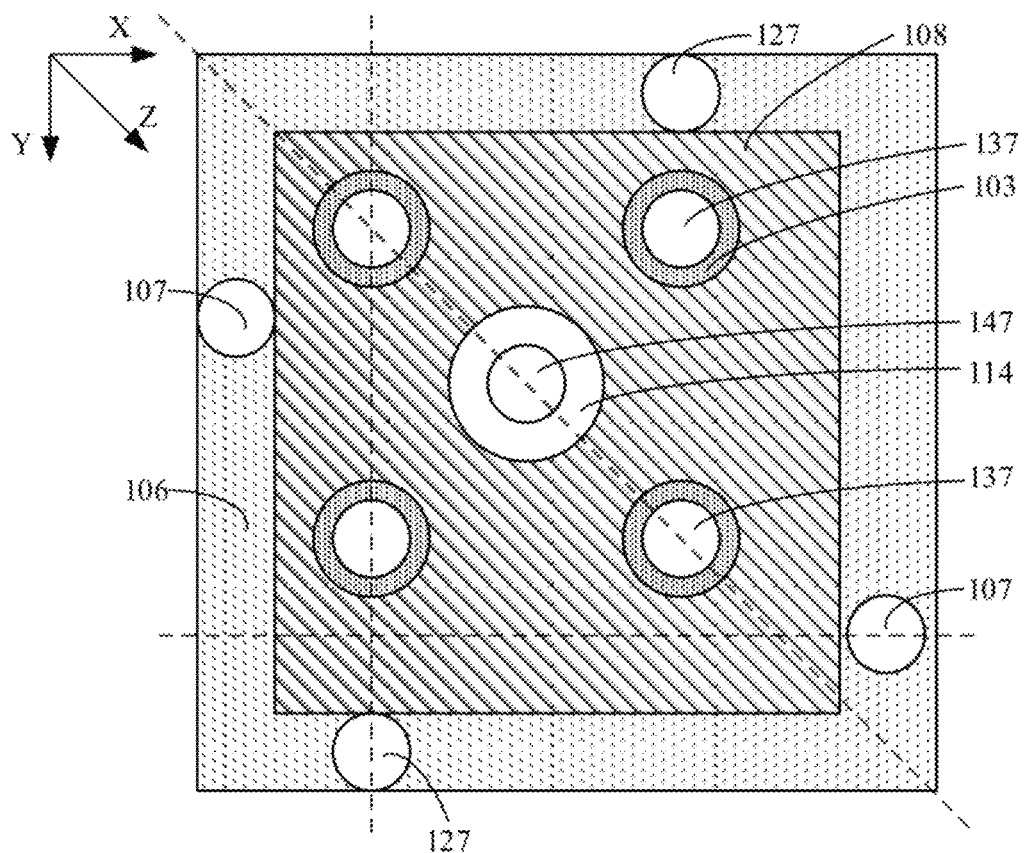
Figure 5:
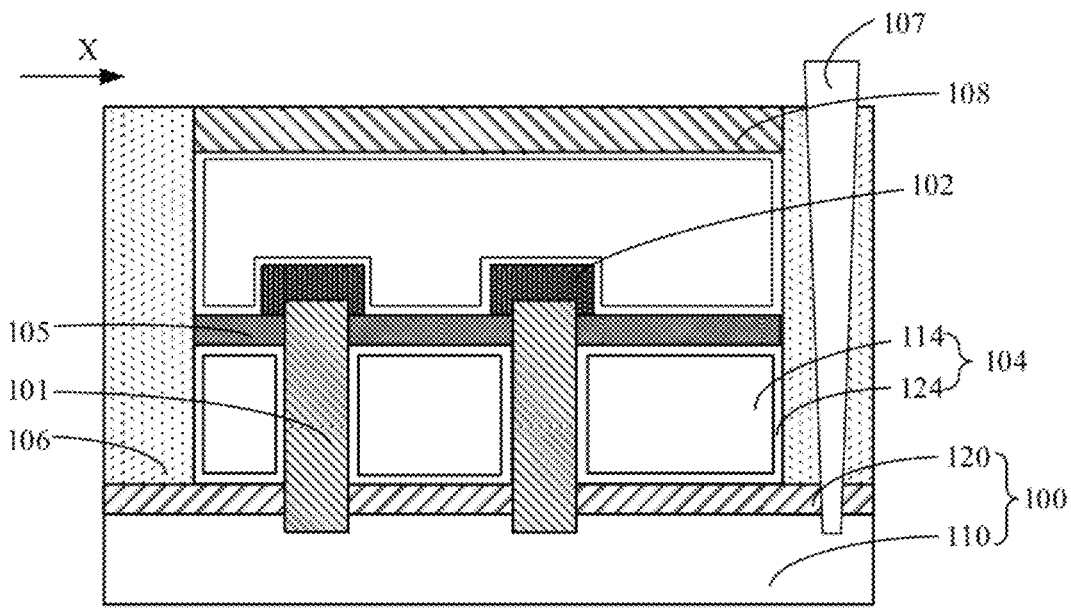
Figure 6:
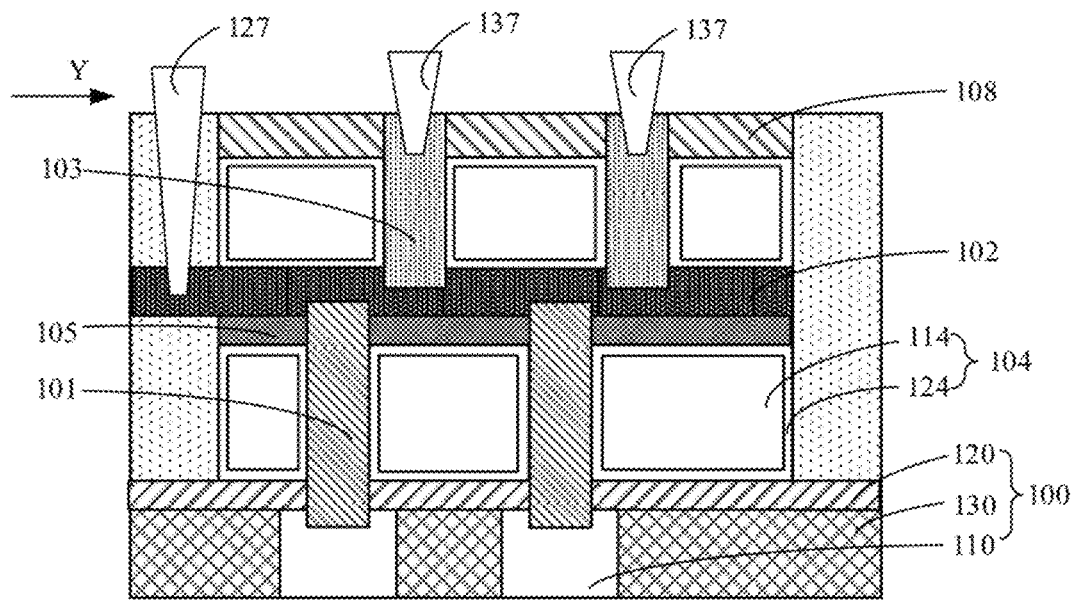
Figure 7:
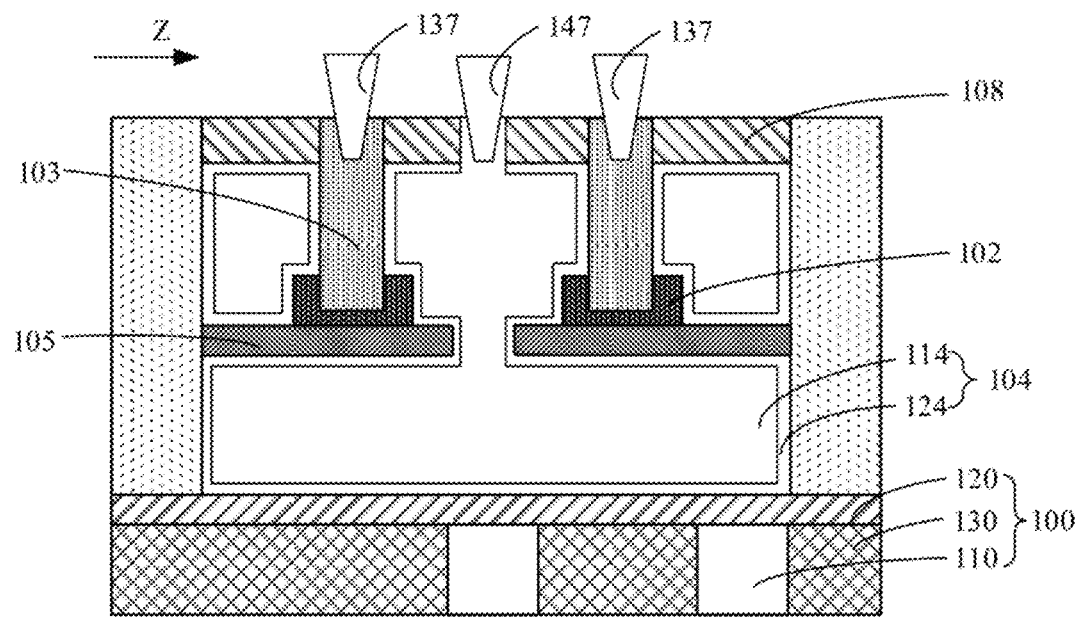

In some embodiments, reference is made to FIG. 4 to FIG. 7. FIG. 4 is another schematic top view of a semiconductor structure according to an embodiment of the disclosure. FIG. 5 is a schematic transverse cross-sectional view of FIG. 4 taken along an X-direction. FIG. 6 is a schematic longitudinal cross-sectional view of FIG. 4 taken along a Y-direction. FIG. 7 is a schematic oblique cross-sectional view of FIG. 4 taken along a Z-direction.

In some embodiments, the first electrical connection structure 110 includes first wire layers extending in a first direction, and each of the first wire layers is in contact with respective first doped areas, arranged in the first direction X, of the first doped areas. The second electrical connection structure 102 includes second wire layers extending in a second direction Y, and each of the second wire layers is in contact with respective second doped areas, arranged in the second direction Y, of the second doped areas and respective third doped areas, arranged in the second direction Y, of the third doped areas.

Specifically, with reference to FIG. 6, the base 100 further includes a first insulation layer 130. The first insulation layer 130 is located in a spacing between any adjacent first wire layers of the first wire layers to realize insulation between the any adjacent first wire layers, and the gate structure 104 is located in a spacing between any adjacent second wire layers of the second wire layers. The material of the first insulation layer 130 is at least one of silicon oxide, silicon nitride, silicon oxynitride or silicon carbonitride. In other examples, a second insulation layer may be provided in a spacing between the adjacent second wire layers for realizing insulation between the adjacent second wire layers. The material of the second insulation layer may also be at least one of silicon oxide, silicon nitride, silicon oxynitride or silicon carbonitride.

Figure 8:
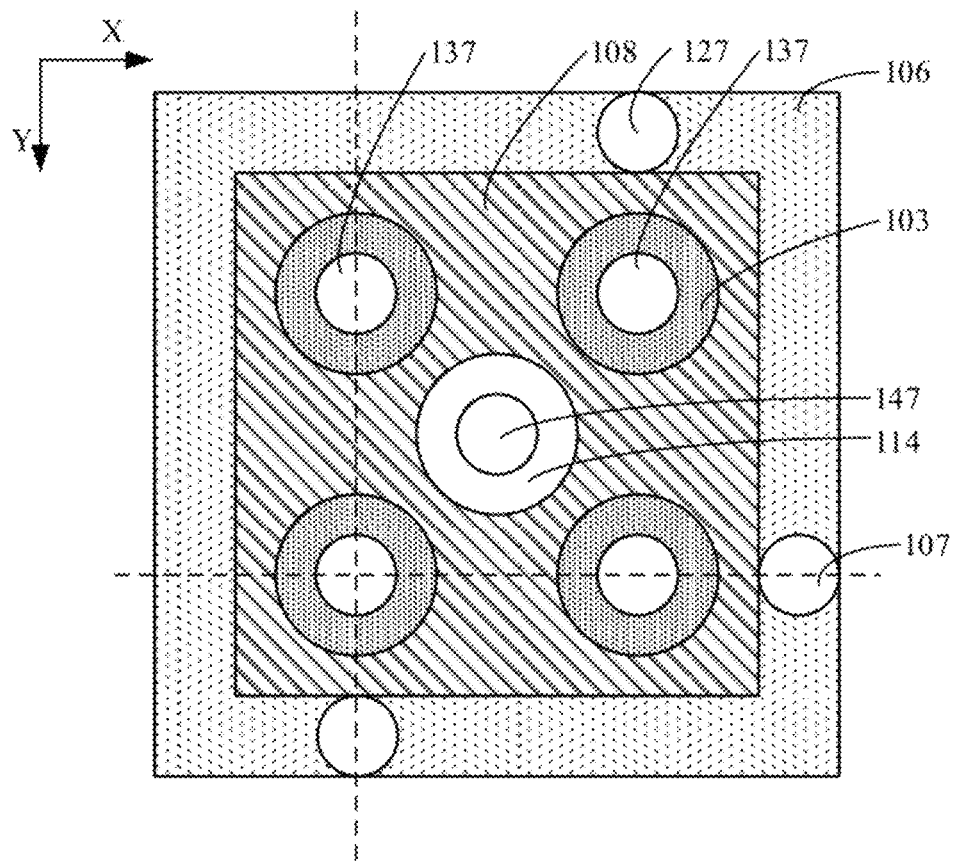
Figure 9:
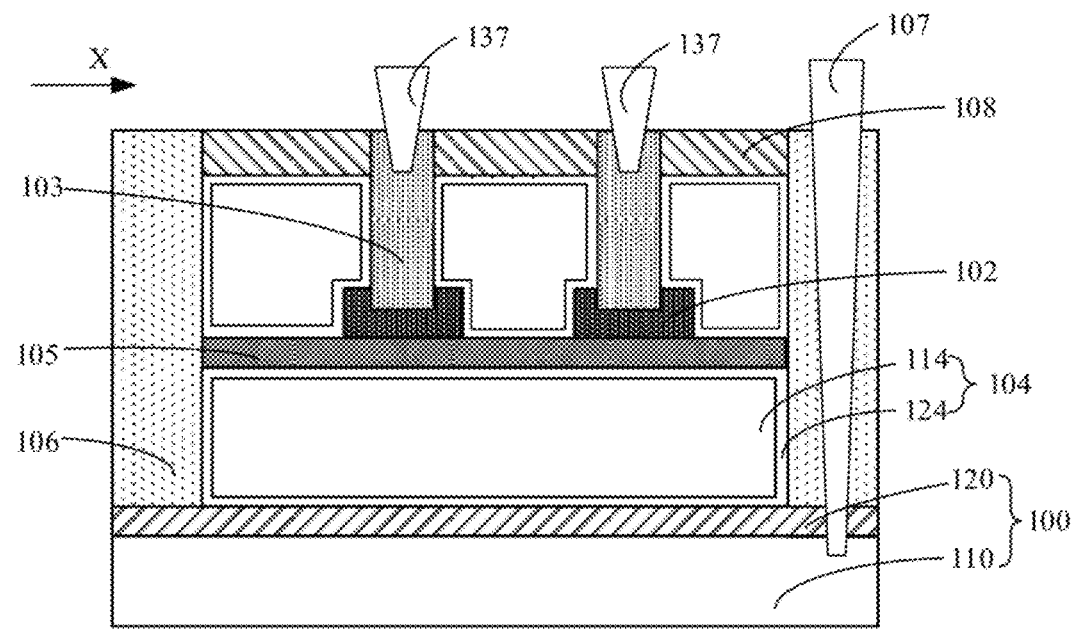
Figure 10:
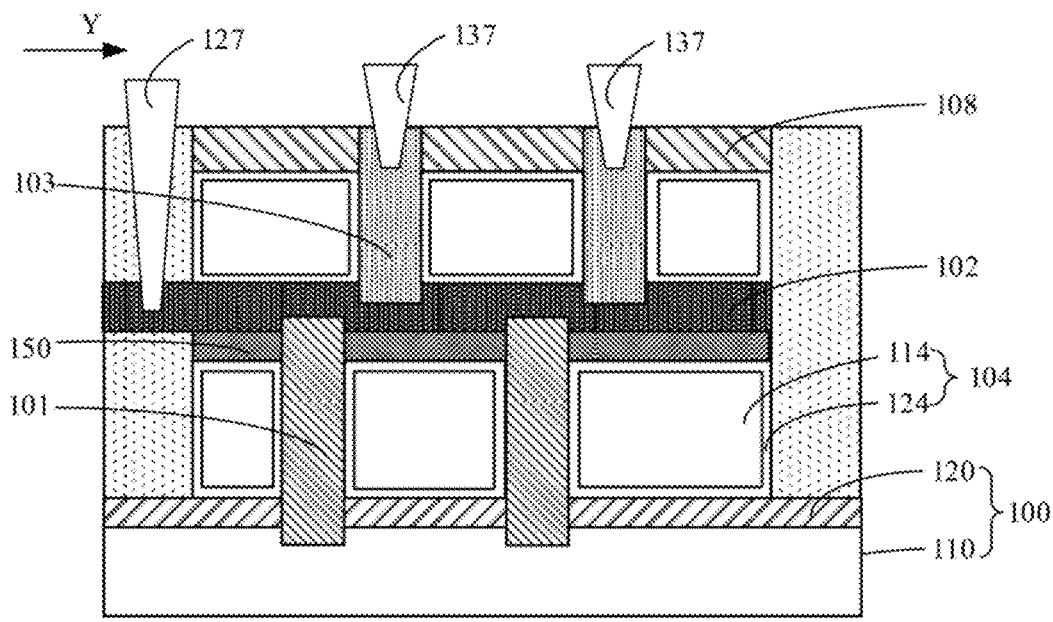

In some embodiments, reference is made to FIG. 8 to FIG. 10. FIG. 8 is still another schematic top view of a semiconductor structure according to an embodiment of the disclosure. FIG. 9 is a schematic transverse cross-sectional view of FIG. 8 taken along an X-direction. FIG. 10 is a schematic longitudinal cross-sectional view of FIG. 8 taken along a Y-direction.

In some embodiments, the first electrical connection structure 110 is a first conductive layer, the first conductive layer is a full-face continuous film layer, and the first conductive layer is in contact with each first doped area. The second electrical connection structure 102 includes second wire layers extending in a second direction Y, and each of the second wire layers is in contact with respective second doped areas, arranged in the second direction Y, of the second doped areas and respective third doped areas, arranged in the second direction Y, of the third doped areas.

Figure 11:
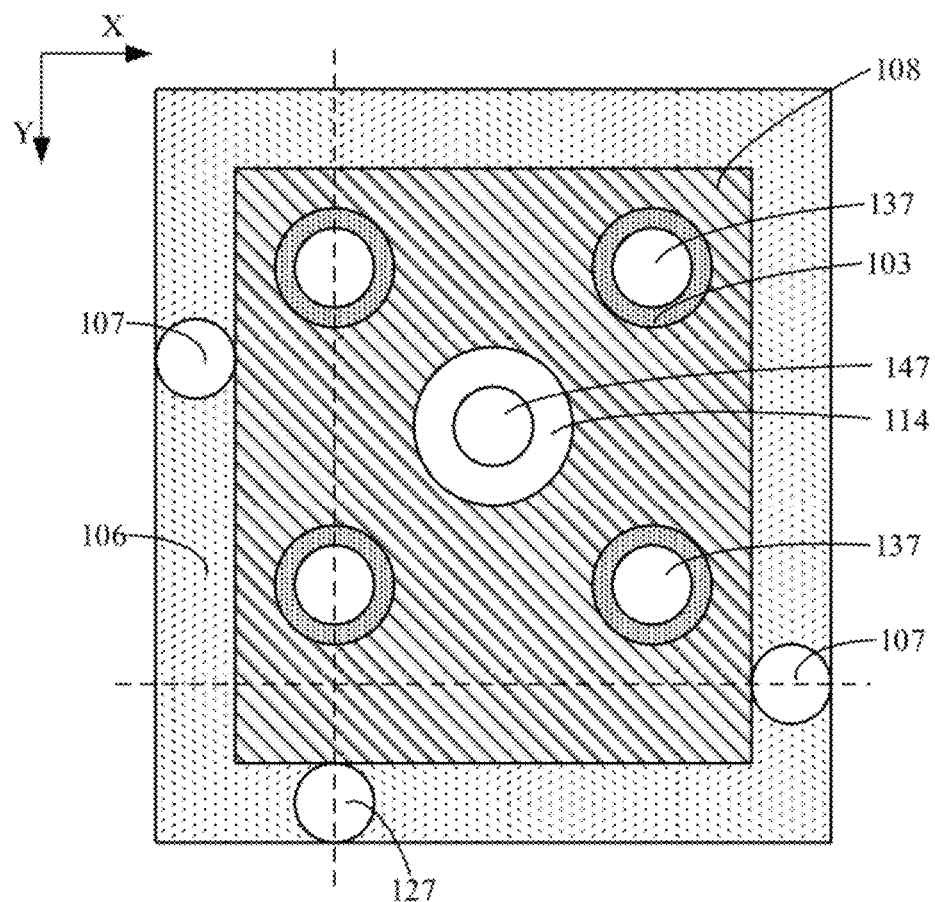
Figure 12:
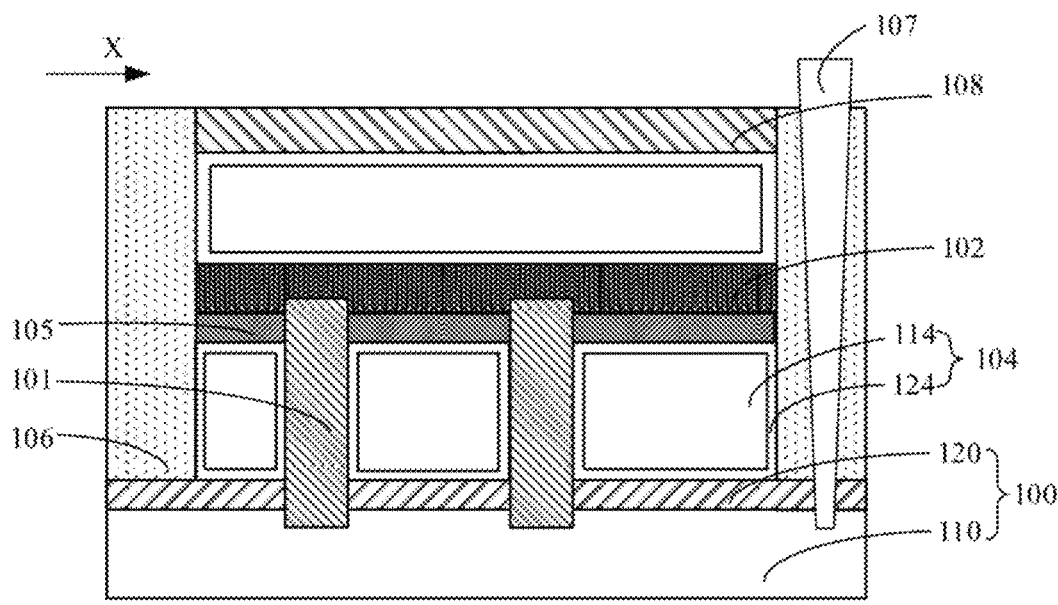
Figure 13:
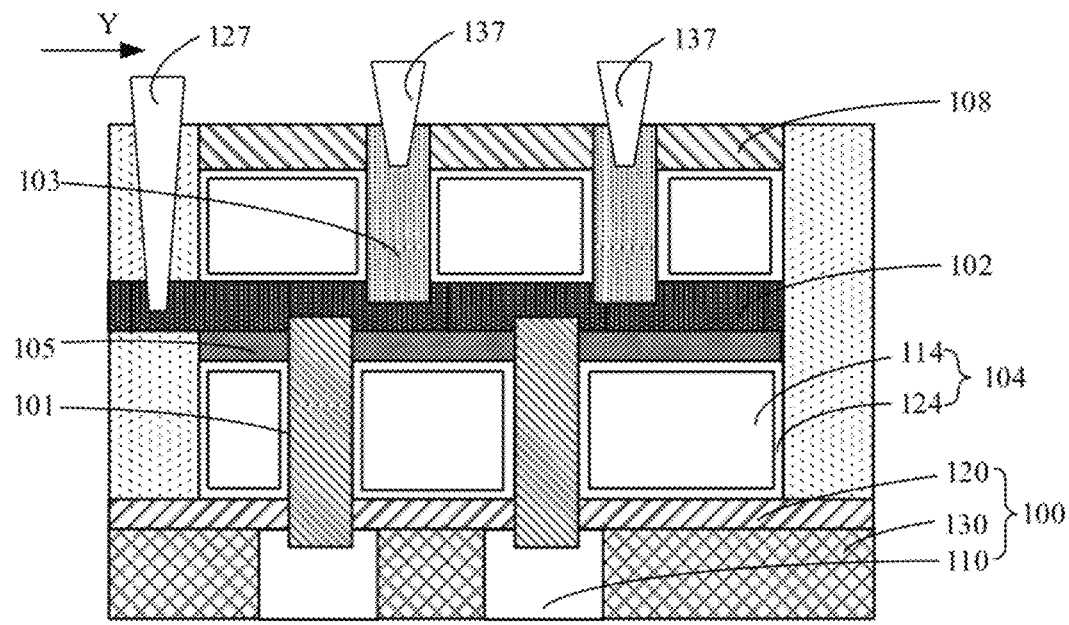

In some embodiments, reference is made to FIG. 11 to FIG. 13. FIG. 11 is yet another schematic top view of a semiconductor structure according to an embodiment of the disclosure. FIG. 12 is a schematic transverse cross-sectional view of FIG. 11 taken along an X-direction. FIG. 13 is a schematic longitudinal cross-sectional view of FIG. 11 taken along a Y-direction.

In some embodiments, the first electrical connection structure 110 includes first wire layers extending along a first direction X, and each of the first wire layers is in contact with respective first doped areas, arranged in the first direction X, of the first doped areas. The second electrical connection structure 102 is a second conductive layer, the second conductive layer is a full-face continuous film layer, and the second conductive layer is in contact with each second doped area and each third doped area. The second conductive layer is provided with a first communication hole penetrating through the second conductive layer, and the first communication hole is filled with the gate structure 104.

Specifically, with reference to FIG. 13, the base 100 further includes a first insulation layer 130. The first insulation layer 130 is located in a spacing between any adjacent first wire layers of the first wire layers to realize insulation between the adjacent first wire layers.

It is to be noted that in the embodiments of the disclosure, the first electrical connection structure 110 may be one first wire layer or at least two first wire layers spaced apart from each other. The second electrical connection structure 102 may be one second wire layer or at least two second wire layers spaced apart from each other. In this embodiment, an example in which the first electrical connection structure 110 is two first wire layers spaced apart from each other and/or the second electrical connection structure 102 is two second wire layers spaced apart from each other is described in detail, which does not limit the disclosure. In other embodiments, there may be one, three or five first wire layers and one, three or five second wire layers, and in specific applications, the number of the first wire layers and the number of the second wire layers may be specifically set according to requirements. In addition, in this embodiment, the two first wire layers are parallel to each other, and the two second wire layers are parallel to each other. In other embodiments, the multiple first wire layers may not be parallel to each other and the multiple second wire layers may not be parallel to each other, as long as there is spacing between any adjacent first wire layers of the multiple first wire layers and there is a spacing between any adjacent second wire layers of the multiple second wire layers.

In this embodiment, an example in which the first direction X is transverse arrangement and the second direction Y is longitudinal arrangement is described in detail, i.e., the first direction X is perpendicular to the second direction Y, which does not limit the disclosure. In other embodiments, an angle is provided between the first direction and the second direction, i.e., the first direction does not coincide with the second direction, so that the electrical connection to the first wire layers and/or the second wire layers can be subsequently realized at different positions. In specific applications, the extension direction of the first wire layers and/or the extension direction of the second wire layers may be determined according to specific requirements. An angle is provided between the first direction and the second direction, which is within the scope of protection of the disclosure.

In the embodiments of the disclosure, the semiconductor structure further includes: a second isolation layer 105 surrounding the second doped area. The top surface of each of the first conductive paths 101 is located higher than the bottom surface of the second isolation layer 105 in the direction from the first doped area to the second doped area, which facilitates ensuring that an end of each of the first conductive paths 101 away from the base 100 has a sufficient area not facing toward the gate structure 104. This area serves as the second doped area of each of the first conductive paths 101. In an exemplary embodiment, the second isolation layer 105 is located between the second electrical connection structure 102 and the gate structure 104, which facilitates preventing electrical crosstalk between the second electrical connection structure 102 and the gate structure 104.

In some embodiments, the material of the second isolation layer 105 is the same as the material of the first isolation layer 120. In other embodiments, the material of the second isolation layer may be different from the material of the first isolation layer. In addition, in other embodiments, there may be no second isolation layer between the second electrical connection structure and the gate structure when the condition that the top surface of each of the first conductive paths is located higher than the bottom surface of the second electrical connection structure and located lower than the top surface of the second electrical connection structure is satisfied.

In this embodiment, the gate structure 104 includes a gate oxide layer 124 and a metal gate layer 114. The gate oxide layer 124 covers a side wall of the first channel area and a side wall of the second channel area, and covers a surface of the first isolation layer 120 away from the first electrical connection structure 110, a surface of the second isolation layer 105 close to the base 100 and a surface of the second electrical connection structure 102 away from the base 100. The metal gate layer 114 is filled in gaps formed by the gate oxide layer 124, to form the gate structure 104.

In the embodiments of the disclosure, the base 100 of the semiconductor structure includes a structure area II and a connection area I. The connection area I is arranged at the periphery of the structure area II, and the first conductive paths and the second conductive paths are both arranged in the structure area II. A peripheral insulation structure 106 is arranged on the base 100 in the connection area I. The first electrical connection structure 110 and the second electrical connection structure 102 extend into the peripheral insulation structure 106 in the connection area I for subsequently electrically connecting the first electrical connection structure 110 with the second electrical connection structure 102 via the connection area I.

Specifically, in this embodiment, a first conductive plug 107 is electrically connected to the first electrical connection structure 110, a second conductive plug 127 is electrically connected to the second electrical connection structure 102, a third conductive plug 137 is electrically connected to the fourth doped area of the second conductive path 103, and a fourth conductive plug 147 is electrically connected to the gate structure 104.

In some embodiments, four distribution manners of the first conductive plug, the second conductive plug, the third conductive plug, and the fourth conductive plug are provided, as described below in conjunction with FIG. 1 to FIG. 13.

In some embodiments, with reference to FIG. 1 to FIG. 3, since each of the first electrical connection structure 110 and the second electrical connection structure 102 is a full-face continuous film layer, there are one first conductive plug 107 and one second conductive plug 127. This facilitates controlling that the respective first doped areas have the same electric potential and each second doped area and each third doped area have the same electric potential, when the semiconductor structure is in operation.

Specifically, the first conductive layer extends into the peripheral insulation structure 106 on a first side of the connection area I and the second conductive layer extends into the peripheral insulation structure 106 on a second side of the connection area I, and the first side and the second side of the connection area I are located on different sides of the structure area II. The extension direction of the first conductive layer is different from the extension direction of the second conductive layer, thereby enabling to derive electrical signals of the first conductive layer and the second conductive layer in the connection area I on different sides of the structure area II, thereby further reducing the horizontal area of the semiconductor structure.

In some embodiments, with reference to FIG. 4 to FIG. 7, since the first electrical connection structure 110 is two first wire layers spaced apart from each other and the second electrical connection structure 102 is two second wire layers spaced apart from each other, there are two first conductive plugs 107 and two second conductive plugs 127. The first conductive plugs 207 are arranged in one-to-one correspondence with the first wire layers, and the second conductive plugs 227 are arranged in one-to-one correspondence with the second wire layers. When the semiconductor structure is in operation, the electric potentials of the first doped areas in contact with the same first wire layer are the same, and the electric potentials of the second doped area and the third doped area in contact with the same second wire layer are the same, which facilitates controlling the electric potentials of the first doped areas in contact with different first wire layers to be different from each other, and controlling the electric potentials of the second doped areas in contact with different second wire layers to be different from each other, or controlling the electric potentials of the third doped areas in contact with different second wire layers to be different from each other, thereby facilitating diversified control of the first conductive paths and the second conductive paths.

In some embodiments, with reference to FIG. 8 to FIG. 10, since the first electrical connection structure 110 is a first conductive layer that is a full-face continuous film layer and the second electrical connection structure 102 is two second wire layers spaced apart from each other, there is one first conductive plug 107, and there are two second conductive plugs 127. When the semiconductor structure is in operation, the electric potentials of the respective first doped areas are the same, and the electric potentials of the second doped area and the third doped area in contact with the same second wire layer are the same, which facilitates controlling the electric potentials of the second doped areas in contact with different second wire layers to be different from each other, or controlling the electric potentials of the third doped areas in contact with different second wire layers to be different from each other.

In some embodiments, with reference to FIG. 11 to FIG. 13, since the first electrical connection structure 110 is two first wire layers spaced apart from each other and the second electrical connection structure 102 is a second conductive layer that is a full-face continuous film layer, there are two first conductive plugs 107, and there is one second conductive plug 127. When the semiconductor structure is in operation, the electric potentials of the first doped areas in contact with the same first wire layer are the same, and each second doped area and each third doped area have the same electric potential, which facilitates controlling the electric potentials of the first doped areas in contact with different first wire layers to be different from each other, and controlling the electric potentials of the second doped areas and the third doped areas to be the same.

It is to be noted that in other embodiments, the number of the first wire layers and/or the number of the second wire layers is/are not limited, as long as the number of the first conductive plugs and/or the number of the second conductive plugs correspond to the number of the first wire layers and/or the number of the second wire layers, respectively.

In the embodiments of the disclosure, the first conductive plug 107 penetrates through the peripheral insulation structure 106 and the first isolation layer 120, and is electrically connected to the first electrical connection structure 110 in the substrate. In an exemplary embodiment, the first conductive plug 107 also penetrates through a portion of the first electrical connection structure 110 to increase the contact area between the first conductive plug 107 and the first electrical connection structure 110, thereby reducing the contact resistance between the first conductive plug 107 and the first electrical connection structure 110.

In some embodiments, the second conductive plug 127 penetrates through a portion of the peripheral insulation structure 106 and is in contact with the second electrical connection structure 102. In some embodiments, the second conductive plug 127 also penetrates through a portion of the second electrical connection structure 102 to increase the contact area between the second conductive plug 127 and the second electrical connection structure 102, thereby reducing the contact resistance between the second conductive plug 127 and the second electrical connection structure 102.

In some embodiments, each of the third conductive plugs 137 is in contact with a respective one of the fourth doped areas. In some embodiments, the third conductive plugs 137 are arranged in one-to-one correspondence with the fourth doped areas, and each of the third conductive plugs 137 also penetrates through a portion of the respective one of the fourth doped areas to increase the contact area between each of the third conductive plugs 137 and the respective one of the fourth doped areas, thereby reducing the contact resistance between each of the third conductive plugs 137 and the respective one of the fourth doped areas. In the embodiments of the disclosure, there are four third conductive plugs 137. In other embodiments, the number of the third conductive plugs is set depending on the actual situation, as long as the number of the third conductive plugs corresponds to the number of the second conductive paths.

In some embodiments, the fourth conductive plug 147 is in contact with the top of the gate structure 104. In some embodiments, the fourth conductive plug 147 also penetrates through a portion of the gate structure 104. In some embodiments, the fourth conductive plug 147 penetrates through a portion of the metal gate layer 114 to increase the contact area between the fourth conductive plug 147 and the metal gate layer 114, thereby reducing the contact resistance between the fourth conductive plug 147 and the metal gate layer 114.

In some embodiments, in order to protect the top surface of the gate structure 104, the semiconductor structure further includes: a protective layer 108 which is arranged around the top of the second conductive path 103 and in contact with the fourth doped area.

In the direction perpendicular to the surface of the base 100, the protective layer 108 is provided with a second communication hole penetrating through the protective layer 108, and the second communication hole is filled with the gate structure 104. In some embodiments, with reference to FIG. 7, an orthographic projection of the first communication hole on the base 100 coincides with an orthographic projection of the second communication hole on the base 100, which facilitates forming the first communication hole and the second communication hole by the same etching process, thereby simplifying the process operations for preparing the semiconductor structure. In other embodiments, the orthographic projection of the first communication hole on the base may not coincide with the orthographic projection of the second communication hole on the base.

Specifically, the top surface of the protective layer 108 is flush with the top surface of the second conductive path 103 to facilitate subsequent packaging and electrical signal extraction of the semiconductor structure.

In other embodiments, the first electrical connection structure includes a third conductive layer and a first conductive layer. The third conductive layer is a full-face film layer structure. A spacing is provided between the third conductive layer and the first conductive layer. An orthographic projection of the first conductive layer on the base and an orthographic projection of the spacing on the base together constitute a first projection. An orthographic projection of the third conductive layer on the base is a second projection. A combined projection of the first projection and the second projection covers at least the structure area of the base. The second electrical connection structure includes a fourth conductive layer and a second conductive layer. The fourth conductive layer is a full-face film layer structure. A spacing is provided between the fourth conductive layer and the second conductive layer. An orthographic projection of the second conductive layer on the base and an orthographic projection of the spacing on the base together constitute a third projection. An orthographic projection of the fourth conductive layer on the base is a fourth projection. A combined projection of the third projection and the fourth projection covers at least the structure area of the base.

In summary, in the embodiments of the disclosure, a first channel area and a second channel area misalign with each other and are stacked onto one another in a direction perpendicular to a surface of a base 100, and a gate structure 104 surrounds the first channel area and the second channel area in a direction parallel to the surface of the base 100, which facilitates saving layout space of a first conductive path 101 and a second conductive path 103 in the direction parallel to the surface of the base 100 while increasing the length of the first channel area and the length of the second channel area. In addition, one of an orthographic projection of the second conductive path 103 on the base 100 and an orthographic projection of the first conductive path 101 on the base 100 includes an area which at least does not partially overlap with another of the orthographic projection of the second conductive path 103 on the base 100 and the orthographic projection of the first conductive path 101 on the base 100, which facilitates preventing electrical interference between the first conductive path 101 and the second conductive path 103, thereby improving the electrical performance of the semiconductor structure.

Another embodiment of the disclosure also provides a semiconductor structure that is substantially the same as the previous embodiment except that the structure of the base is different. The semiconductor structure according to another embodiment of the disclosure will be described in detail below in conjunction with the drawings. It is to be noted that the same or corresponding parts as the previous embodiments may be referred to the detailed description of the foregoing embodiments and will not be described in detail herein.

Figure 14:
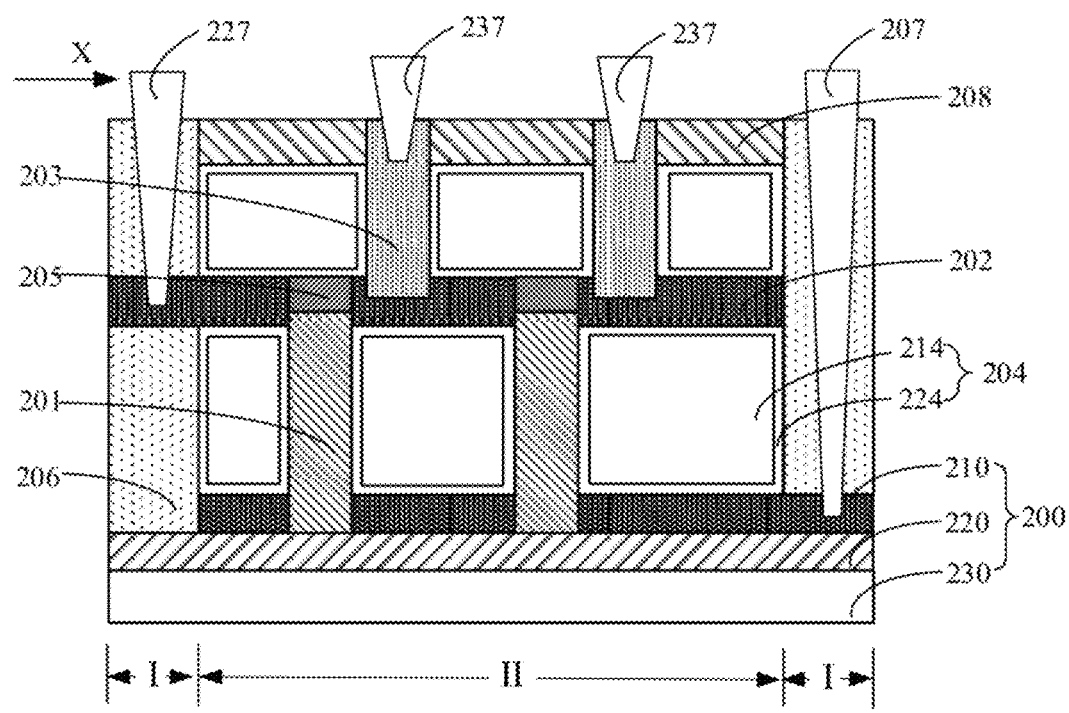
FIG. 14 to FIG. 22 are schematic structural diagrams of a semiconductor structure according to another embodiment of the disclosure.
Figure 15:
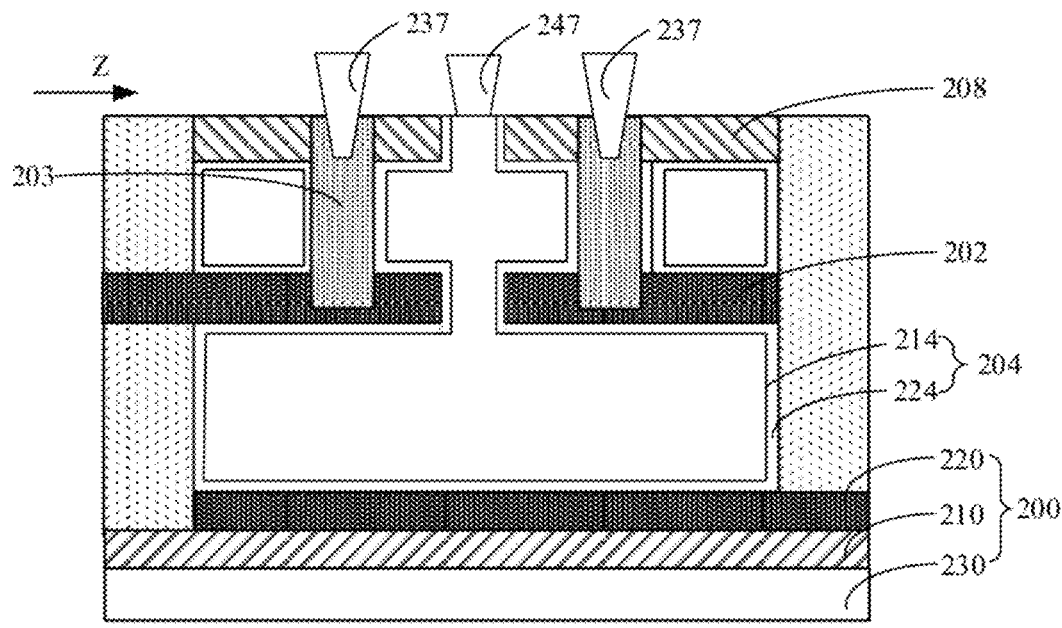

FIG. 14 to FIG. 22 are schematic diagrams of a semiconductor structure according to another embodiment of the disclosure. In conjunction with FIG. 1, FIG. 14 is a schematic transverse cross-sectional view of FIG. 1 taken along an X-direction, and FIG. 15 is a schematic oblique cross-sectional view of FIG. 1 taken along a Z-direction.

With reference to FIG. 14 to FIG. 15, in some embodiments, a semiconductor structure includes: a base 200 and a first conductive path 201 located on the base 200; a first electrical connection structure 210; a second electrical connection structure 202; a second conductive path 203; and a gate structure 204. The first conductive path 201 includes, in a direction perpendicular to a surface of the base 200, a first channel area (not identified), a first doped area (not identified) and a second doped area (not identified). The first doped area is located at one end of the first channel area, and the second doped area is located at another end of the first channel area opposite to said one end. The first electrical connection structure 210 is located in the base 200 and in contact with the first doped area. The second electrical connection structure 202 is in contact with the second doped area, and a plane where the second electrical connection structure 202 is located is parallel to a plane where the first electrical connection structure 210 is located. The second conductive path 203 includes, in the direction perpendicular to the surface of the base 200, a second channel area (not identified), a third doped area (not identified) and a fourth doped area (not identified). The third doped area is located at one end of the second channel area, and the fourth doped area is located at another end of the second channel area opposite to said one end. The third doped area is in contact with a side of the second electrical connection structure 202 away from the base 200. One of an orthographic projection of the second conductive path 203 on the base 200 and an orthographic projection of the first conductive path 201 on the base includes an area which at least does not partially overlap with another of the orthographic projection of the second conductive path 203 on the base 200 and the orthographic projection of the first conductive path 201 on the base. The gate structure 204 surrounds the first channel area and the second channel area.

With continuous reference to FIG. 14, in some embodiments, in a direction from the first doped area to the second doped area, the base 200 includes: a substrate 230, a first isolation layer 200 and a first electrical connection structure 210 successively stacked onto one another. The first conductive path 201 penetrates through at least a portion of the first electrical connection structure 210.

In some embodiments, with reference to FIG. 14, the first conductive path 201 penetrates through the first electrical connection structure 210, and then a part of an end of the first conductive path 201 close to the first electrical connection structure 210 is located in the first electrical connection structure 210, such that there is a larger contact area between the first electrical connection structure 210 and the first doped area, thereby ensuring the stability of electrical connection between the first electrical connection structure 210 and the first doped area.

In this embodiment, in the direction from the first doped area to the second doped area, the semiconductor structure further includes: a passivation layer 205, located on a top surface of the first conductive path 201, and the top surface of the first conductive path 201 is located higher than a bottom surface of the second electrical connection structure 202. The passivation layer 205 is located between the first conductive path 201 and the gate structure 204, thereby preventing the contact between the top surface of the first conductive path 201 and the gate structure 204, which facilitates reducing electrical interference between the first conductive path 201 and the gate structure 204.

In this embodiment, the base 200 of the semiconductor structure includes a structure area II and a connection area I. The connection area I is arranged at the periphery of the structure area II, and each of the first conductive path and the second conductive path is arranged in the structure area II. A peripheral insulation structure 206 is arranged on the base 200 in the connection area I. The first electrical connection structure 210 and the second electrical connection structure 202 extend into the peripheral insulation structure 206 in the connection area I for subsequently electrically connecting the first electrical connection structure 210 with the second electrical connection structure 202 via the connection area I.

Specifically, in this embodiment, the first conductive plug 207 is electrically connected to the first electrical connection structure 210, the second conductive plug 227 is electrically connected to the second electrical connection structure 202, the third conductive plug 237 is electrically connected to the fourth doped area of the second conductive path 203, and the fourth conductive plug 247 is electrically connected to the gate structure 204.

Specifically, this embodiment provides four distribution manners of the first electrical connection structure, the second electrical connection structure, the first conductive plug, the second conductive plug, the third conductive plug, and the fourth conductive plug, as described below in conjunction with FIG. 14 to FIG. 22.

In some embodiments, with continued reference to FIG. 14 and FIG. 15, the first electrical connection structure 210 is a first conductive layer, the first conductive layer is a full-face continuous film layer, and the first conductive layer is in contact with each first doped area. The second electrical connection structure 202 is a second conductive layer, the second conductive layer is a full-face continuous film layer, and the second conductive layer is in contact with each second doped area and each third doped area. The second conductive layer is provided with a first communication hole penetrating through the second conductive layer, and the first communication hole is filled with the gate structure 104.

Specifically, the second conductive layer is also provided with a via for accommodating the passivation layer 205 and the second doped area, and the second conductive layer is also provided with a groove for accommodating the third doped area. There are one first conductive plug 207 and one second conductive plug 227.

Figure 16:
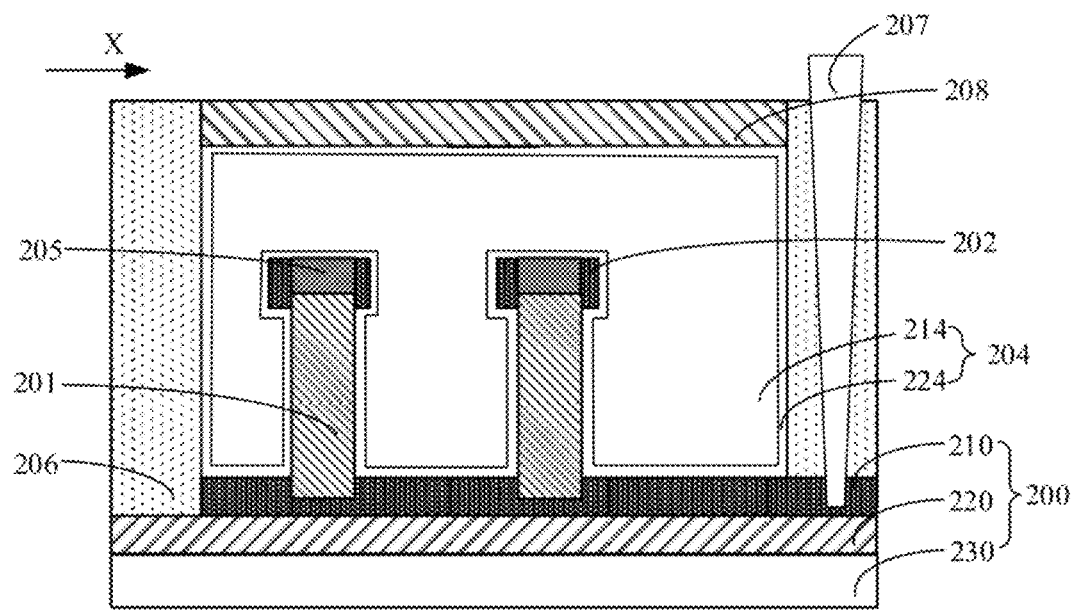
Figure 17:
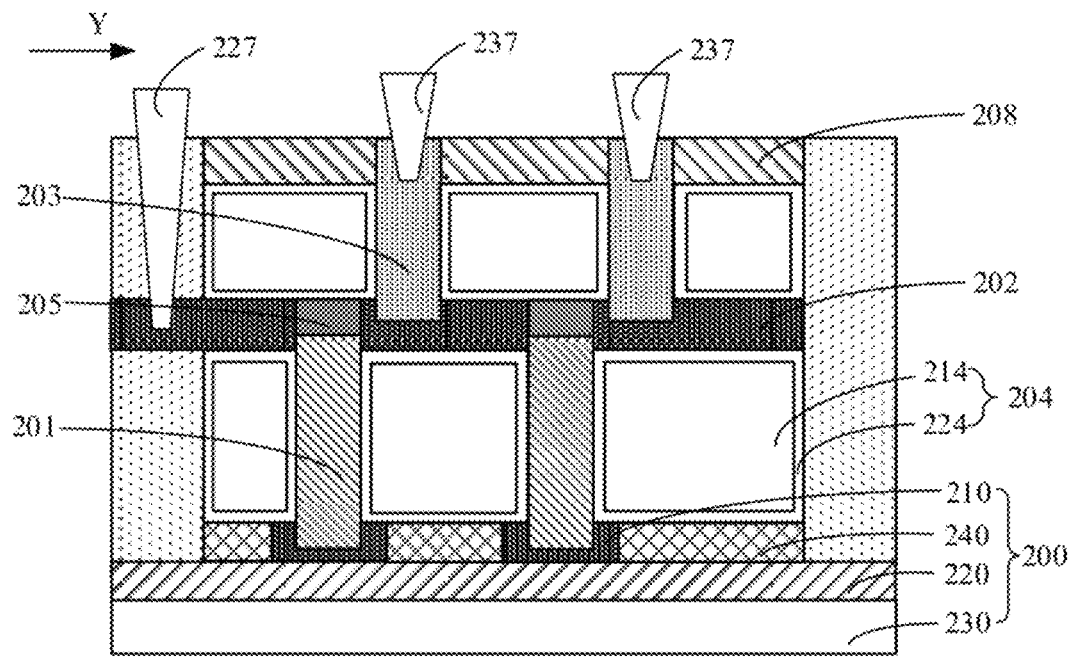
Figure 18:
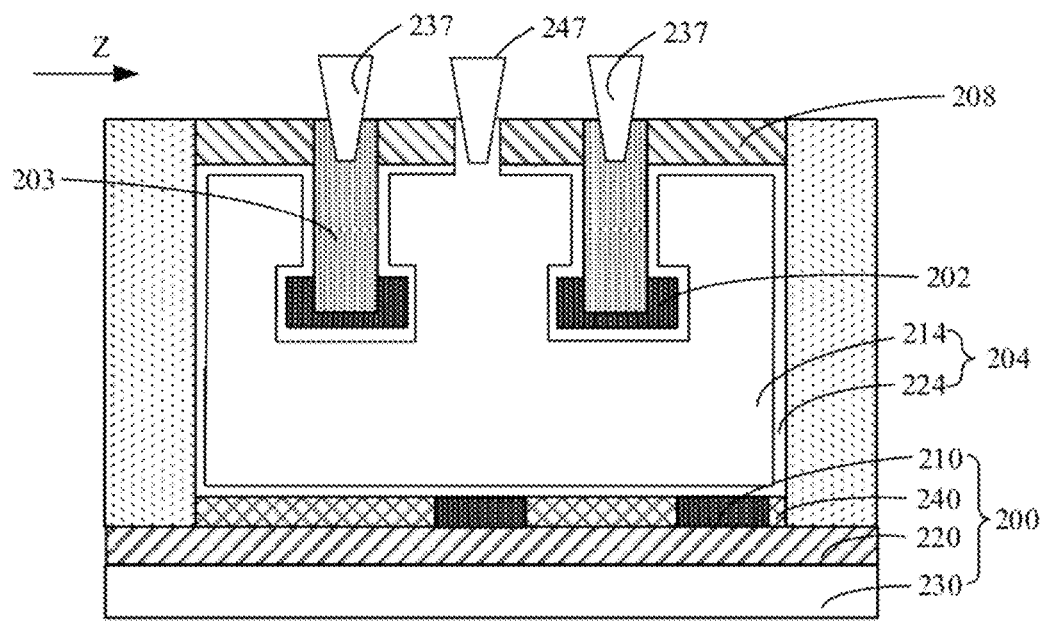

In some embodiments, reference is made to FIG. 16 to FIG. 18. With reference to FIG. 4, FIG. 16 is a schematic transverse cross-sectional view of FIG. 4 taken along an X-direction, FIG. 17 is a schematic longitudinal cross-sectional view of FIG. 4 taken along a Y-direction, and FIG. 18 is a schematic oblique cross-sectional view of FIG. 4 taken along a Z-direction.

In some embodiments, the first electrical connection structure 210 includes first wire layers extending in a first direction, and each of the first wire layers is in contact with respective first doped areas, arranged in the first direction X, of the first doped areas. The second electrical connection structure 202 includes second wire layers extending in a second direction Y, and each of the second wire layers is in contact with respective second doped areas, arranged in the second direction Y, of the second doped areas and respective third doped areas, arranged in the second direction Y, of the third doped areas.

Specifically, with reference to FIG. 17, the base 200 further includes a first insulation layer 240. The first insulation layer 240 is located in a spacing between any adjacent first wire layers of the first wire layers to realize insulation between the any adjacent first wire layers, and the gate structure 204 is located in a spacing between any adjacent second wire layers of the second wire layers. The material of the first insulation layer 240 is at least one of silicon oxide, silicon nitride, silicon oxynitride or silicon carbonitride. In other examples, a second insulation layer may be provided in a spacing between the adjacent second wire layers for realizing insulation between the adjacent second wire layers. The material of the second insulation layer may also be at least one of silicon oxide, silicon nitride, silicon oxynitride or silicon carbonitride. In other examples, the gate structure may also be arranged between the spacing between any adjacent first wire layers.

In some embodiments, the first electrical connection structure 210 is two first conductive layers spaced apart from each other, the second electrical connection structure 202 is two second wire layers spaced apart from each other, and there are two first conductive plugs 207 and two second conductive plugs 227.

In some embodiments, the first conductive paths 201 and the second conductive paths 203 are cylindrical. In a direction perpendicular to the first direction X, the width of each of the first wire layers is greater than the diameter of each of the first conductive paths 201. In a direction perpendicular to the second direction Y, the width of each of the second wire layers is greater than the diameter of each of the first conductive paths 201 and the diameter of each of the second conductive paths 203. This facilitates isolating the first doped areas from the gate structure 204 by the first conductive layers to prevent electrical interference between the first doped areas and the gate structure 204, and isolating the second doped areas and the third doped areas from the gate structure 204 by the second conductive layers to prevent electrical interference between the second doped areas and the gate structure 204 as well as electrical interference between the third doped areas and the gate structure 204. In an exemplary embodiment, the peripheries of the first doped areas are surrounded by the first wire layers, which facilitates increasing the contact area between each of the first wire layers and the respective first doped areas to reduce the contact resistance between each of the first wire layers and the respective first doped areas. The peripheries of the second doped areas and the peripheries of the third doped areas are surrounded by the second wire layers, which facilitates increasing the contact area between each of the second wire layers and the respective second doped areas and the contact area between each of the second wire layers and the respective third doped areas to reduce the contact resistance between each of the second wire layers and the respective second doped areas and the contact resistance between each of the second wire layers and the respective third doped areas.

Figure 19:
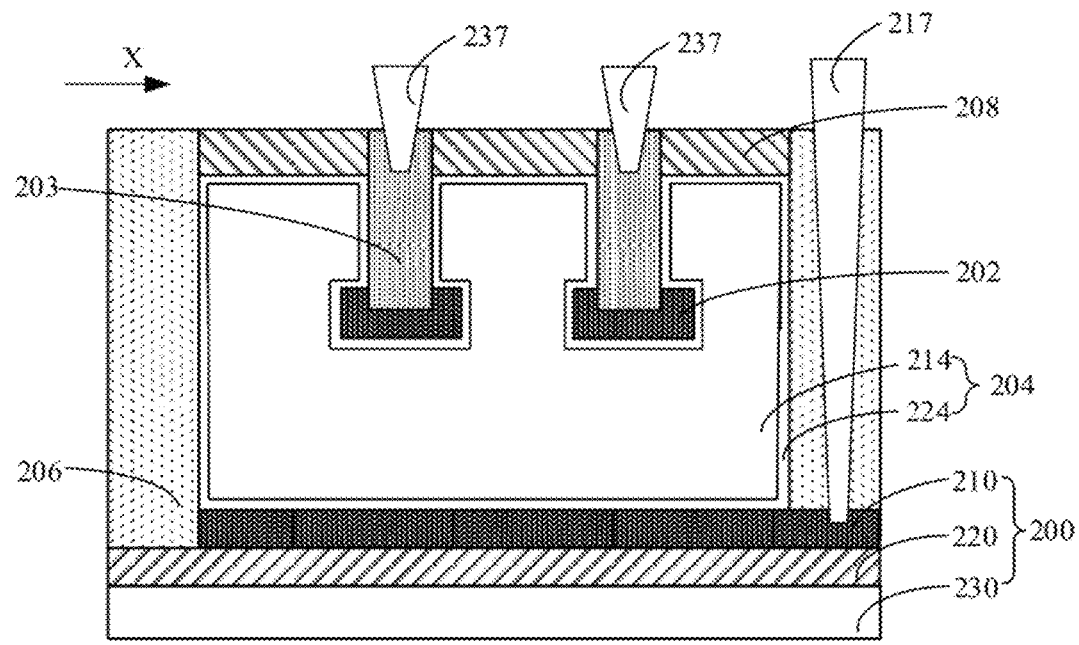
Figure 20:
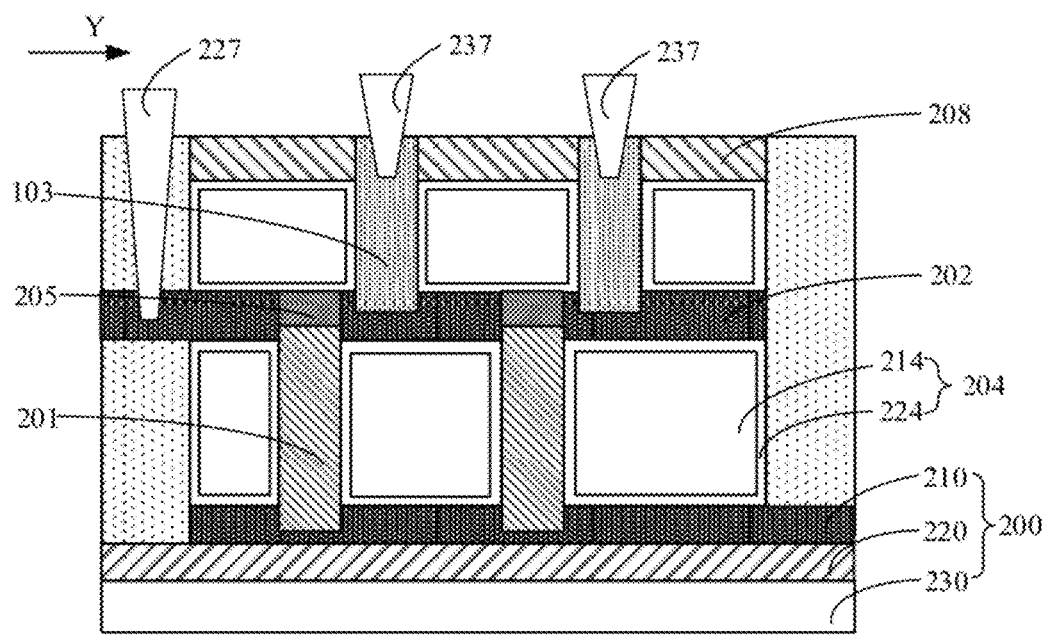

In some embodiments, reference is made to FIG. 19 and FIG. 20. With reference to FIG. 8, FIG. 19 is a schematic transverse cross-sectional view of FIG. 8 taken along an X-direction, and FIG. 20 is a schematic longitudinal cross-sectional view of FIG. 8 taken along a Y-direction.

In some embodiments, the first electrical connection structure 210 is a first conductive layer, the first conductive layer is a full-face continuous film layer, and the first conductive layer is in contact with each first doped area. The second electrical connection structure 202 includes second wire layers extending in a second direction Y, and each of the second wire layers is in contact with respective second doped areas, arranged in the second direction Y, of the second doped areas and respective third doped areas, arranged in the second direction Y, of the third doped areas.

In some embodiments, the gate structure 204 is located in a spacing between any adjacent second wire layers of the second wire layers. In other examples, a second insulation layer may be provided in the spacing between the adjacent second wire layers to realize insulation between the adjacent second wire layers. In an exemplary embodiment, the first electrical connection structure 210 is a first conductive layer that is a full-face continuous film layer and the second electrical connection structure 202 is two second wire layers spaced apart from each other. Therefore, there is one first conductive plug 207, and there are two second conductive plugs 227.

Figure 21:
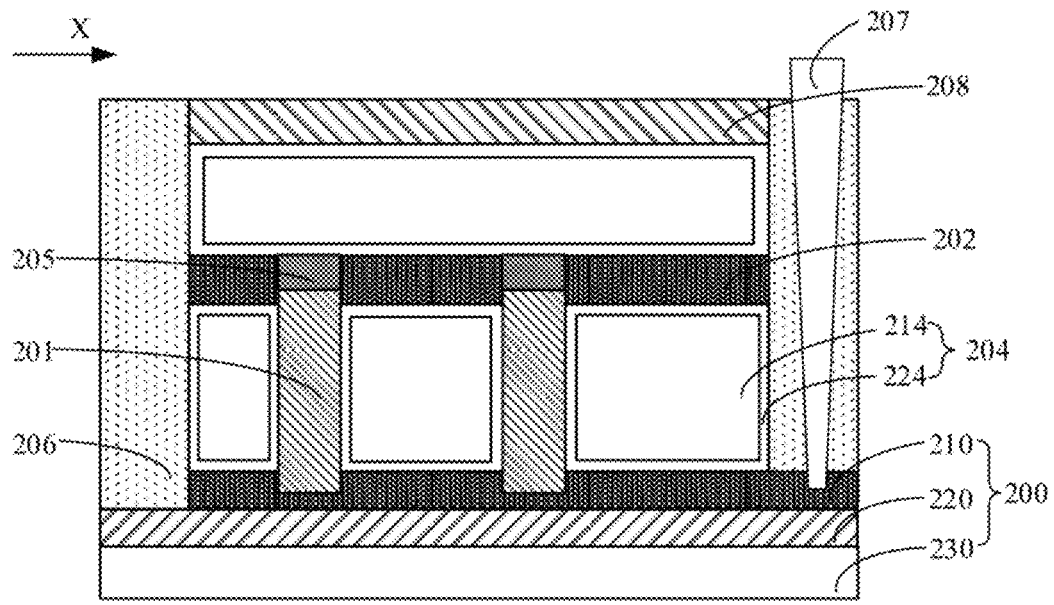
Figure 22:
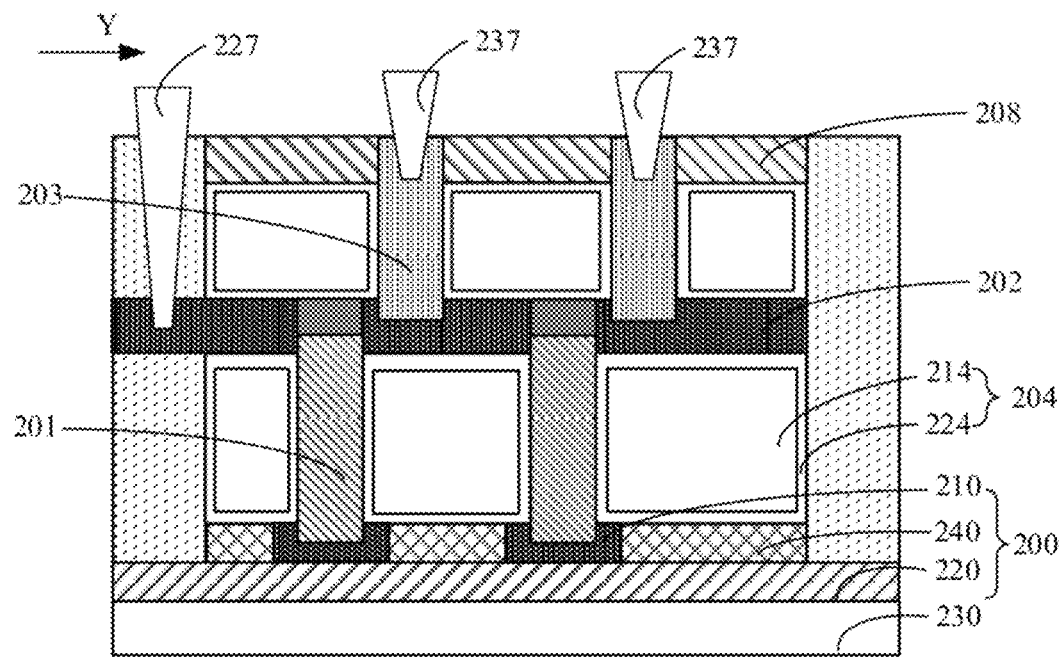

In some embodiments, reference is made to FIG. 21 and FIG. 22. With reference to FIG. 11, FIG. 21 is a schematic transverse cross-sectional view of FIG. 11 taken along an X-direction, and FIG. 22 is a schematic longitudinal cross-sectional view of FIG. 11 taken along a Y-direction.

In some embodiments, the first electrical connection structure 210 includes first wire layers extending along a first direction X, and each of the first wire layers is in contact with respective first doped areas, arranged in the first direction X, of the first doped areas. The second electrical connection structure 202 is a second conductive layer, the second conductive layer is a full-face continuous film layer, and the second conductive layer is in contact with each second doped area and each third doped area. The second conductive layer is provided with a first communication hole penetrating through the second conductive layer, and the first communication hole is filled with the gate structure 204.

Specifically, the first electrical connection structure 210 is two first wire layers spaced apart from each other, and the second electrical connection structure 202 is a second conductive layer that is a full-face continuous film layer. Therefore, there are two first conductive plugs 207, and there is one second conductive plug 227.

In some embodiments, with reference to FIG. 22, the base 200 further includes a first insulation layer 240. The first insulation layer 240 is located in a spacing between any adjacent first wire layers of the first wire layers to realize insulation between the adjacent first wire layers. The material of the first insulation layer 240 is at least one of silicon oxide, silicon nitride, silicon oxynitride or silicon carbonitride. In other examples, the gate structure may also be arranged in the spacing between the adjacent first wire layers.

In summary, in the embodiments of the disclosure, a first channel area and a second channel area misalign with each other and are stacked onto one another in a direction perpendicular to a surface of a base 200, which facilitates saving layout space of a first conductive path 201 and a second conductive path 203 in a direction parallel to the surface of the base 200. In addition, one of an orthographic projection of the second conductive path 203 on the base 200 and an orthographic projection of the first conductive path 201 on the base 200 includes an area which at least does not partially overlap with another of the orthographic projection of the second conductive path 203 on the base 200 and the orthographic projection of the first conductive path 201 on the base 200, which facilitates preventing electrical interference between the first conductive path 201 and the second conductive path 203, thereby improving the electrical performance of the semiconductor structure.

Embodiments of the disclosure also provide a method for forming a semiconductor structure, to form the semiconductor structure according to any of the embodiments described above.

FIG. 23 to FIG. 45 are schematic diagrams corresponding to various operations in a method for forming a semiconductor structure according to this embodiment. Hereinafter, the method for forming the semiconductor structure according to this embodiment will be described in detail with reference to the accompanying drawings, and portions identical to or corresponding to the above-mentioned embodiments will not be described in detail.

With reference to FIG. 23 to FIG. 27, in some embodiments, a base 100 is provided. The base 100 includes a substrate 140, a first electrical connection structure 110 and a first isolation layer 120.

Figure 23:
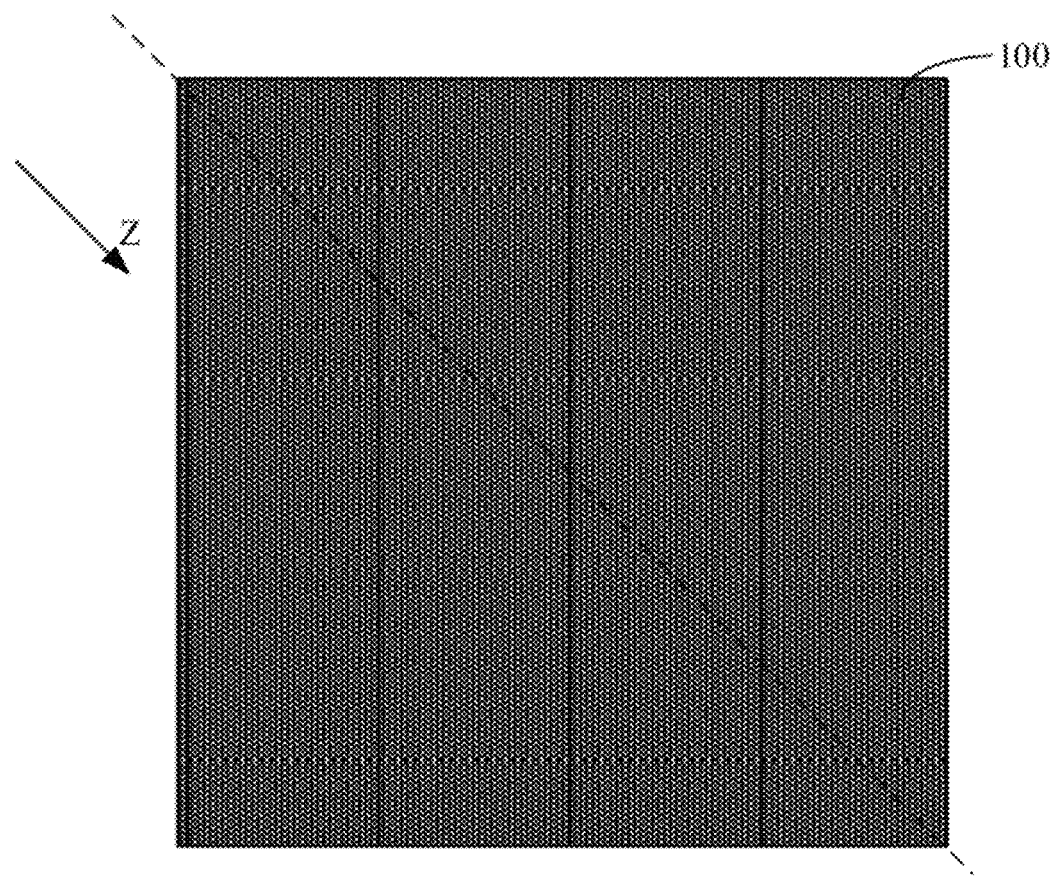
FIG. 23 to FIG. 45 are schematic diagrams corresponding to various operations in a method for forming a semiconductor structure according to an embodiment of the disclosure.
Figure 24:
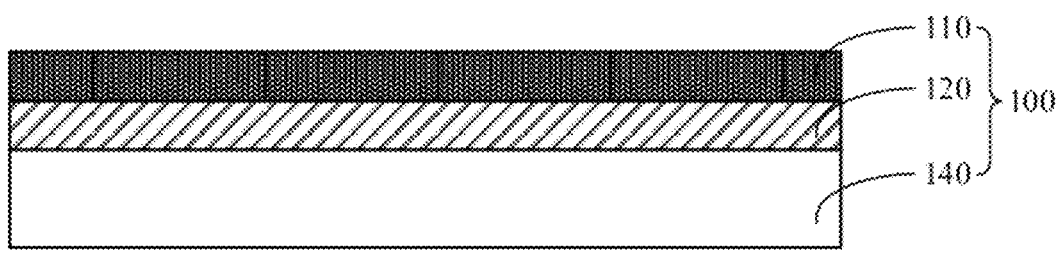

In some embodiments, reference is made to FIG. 23 and FIG. 24. FIG. 24 is a schematic oblique cross-sectional view of FIG. 23 taken along a Z-direction. The operation that the base 100 is provided includes the following operations. The substrate 140 is provided, the first isolation layer 120 is formed on the substrate 140, and the first electrical connection structure 110 is formed on the first isolation layer 120.

Figure 25:
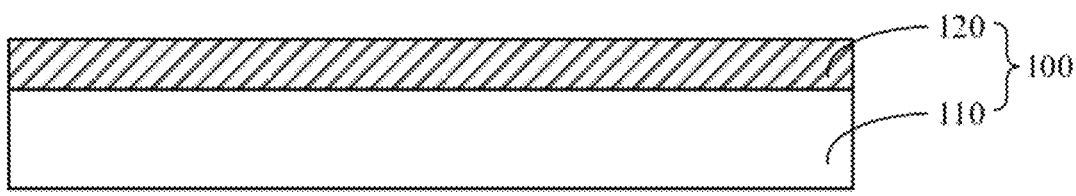
Figure 26:
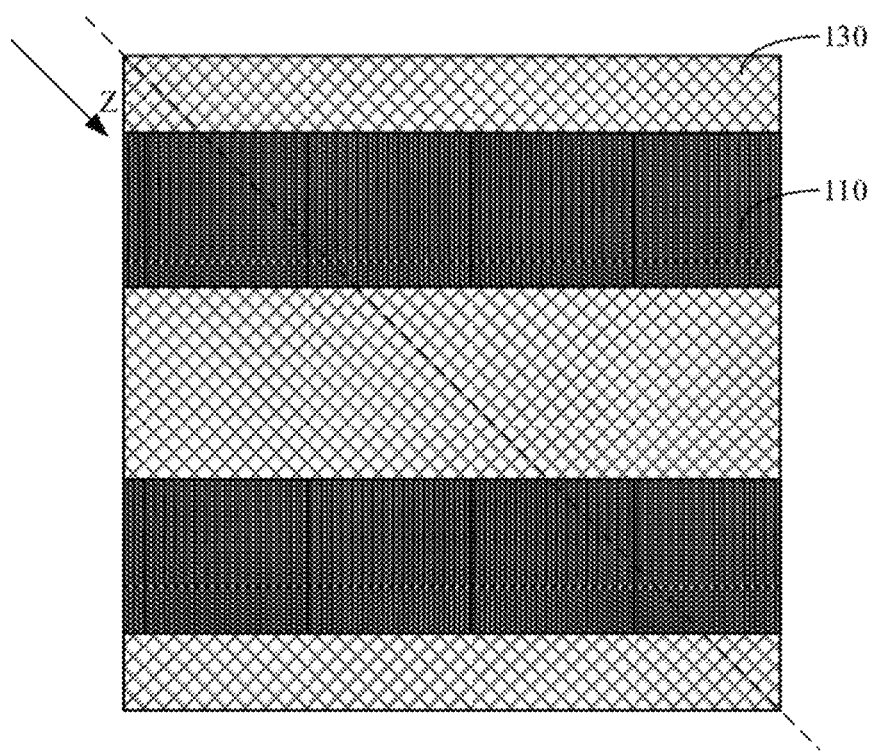

In some embodiments, reference is made to FIG. 25. FIG. 25 is a schematic oblique cross-sectional view of a base 100. The operation that the base 100 is provided includes the following operations. A substrate (not shown) is provided, a first electrical connection structure 110 is formed in the substrate, and a first isolation layer 120 is formed on the substrate.

Specifically, the material of the substrate is monocrystalline silicon, and the first electrical connection structure 110 is formed by an epitaxial growth process on the basis of the substrate, which facilitates the subsequent formation of the first conductive path 101 on the basis of the first electrical connection structure 110 by the epitaxial growth process.

In the embodiments of the disclosure, there are two manners of forming the first electrical connection structure 110, and this embodiment is described with reference to an example in which the first electrical connection structure 110 is formed on the first isolation layer 120.

Figure 27:
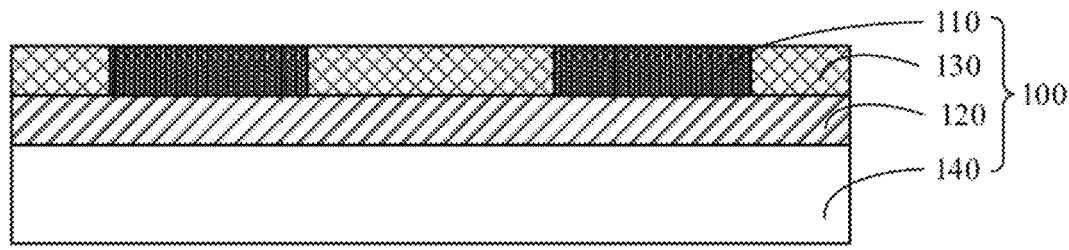

In this embodiment, with reference to FIG. 23 and FIG. 24, the first electrical connection structure 110 is a first conductive layer that is a full-face continuous film layer. In other embodiments, reference is made to FIG. 26 and FIG. 27. FIG. 27 is a schematic oblique cross-sectional view of FIG. 26 taken along a Z-direction. The first electrical connection structure 110 includes first wire layers extending in a first direction X. In addition, a first insulation layer 130 is formed between any adjacent first wire layers of the first wire layers. The first insulation layer 130 is formed of an insulating material to improve the stability of the semiconductor structure. In other embodiments, if the first electrical connection structure is formed in the substrate, the first electrical connection structure may be a first conductive layer or first wire layers extending in a first direction.

In this embodiment, the material for the substrate 140 includes silicon, silicon carbide, gallium arsenide, aluminum nitride or zinc oxide, etc. In this embodiment, the substrate 140 is formed of a silicon material. In this embodiment, the silicon material is used as the substrate 140 in order to facilitate those skilled in the art to understand the subsequent formation method, which does not limit the disclosure. In the practical application, a suitable material for the substrate 140 may be selected according to requirements. In addition, the material for the first isolation layer 120 is at least one of silicon nitride, silicon carbonitride or silicon carbonitride oxide. The first electrical connection structure 110 is formed of a semiconductor conductive material or a metal conductive material, such as doped silicon or tungsten.

Figure 28:
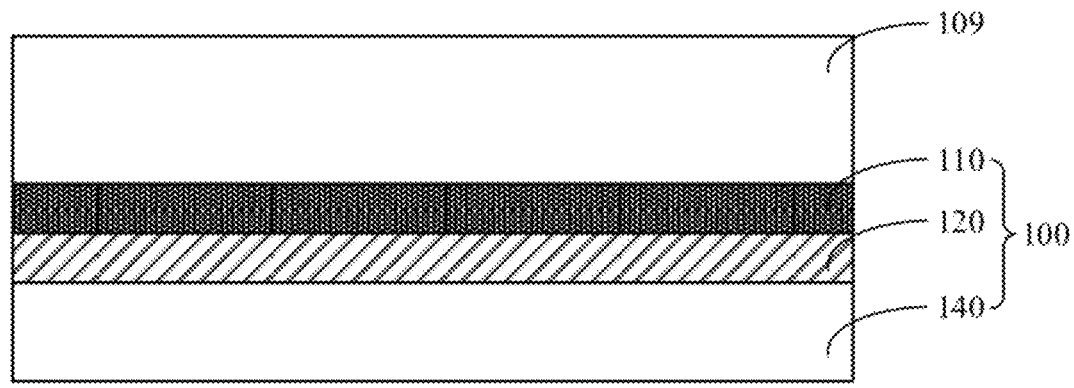

In some embodiments, with reference to FIG. 28, a first sacrificial layer 109 is formed on the base 100.

In this embodiment, the first sacrificial layer 109 is formed by means of spin coating, and the first sacrificial layer 109 may be deposited with a high deposition rate by means of spin coating, such that the first sacrificial layer 109 with a large thickness may be deposited in a relatively short time. In addition, the first sacrificial layer 109 is formed of a semiconductor material containing carbon or oxygen, and the first sacrificial layer 109 may be subsequently removed by ashing or dry etching without affecting other structures.

Figure 29:
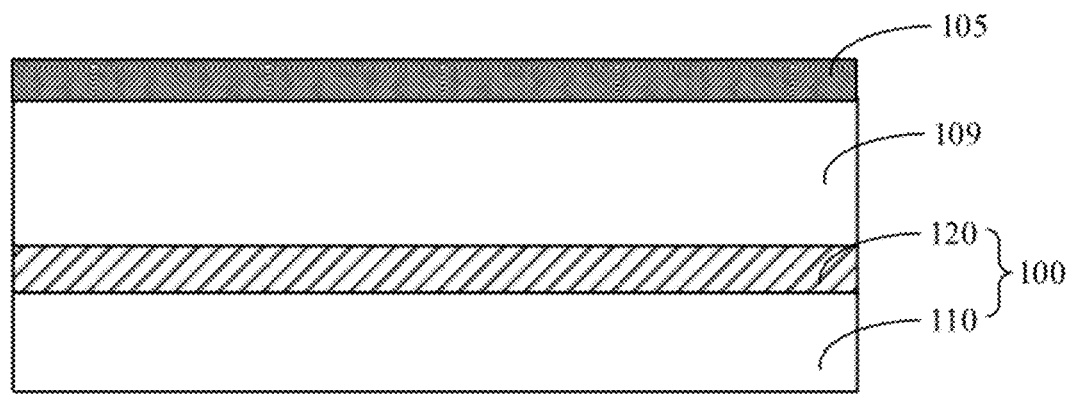

In some embodiments, the first electrical connection structure 110 is formed in the substrate. With reference to FIG. 29, a second isolation layer 105 is formed on the first sacrificial layer 109.

Figure 30:
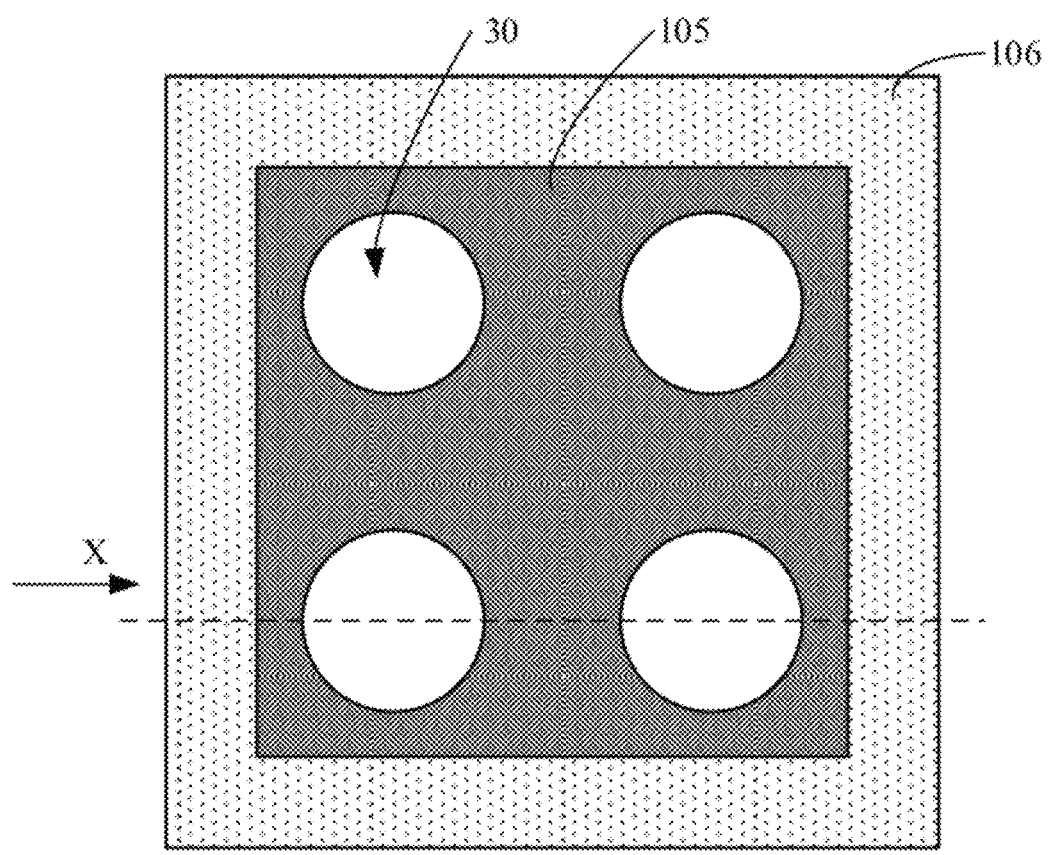
Figure 31:
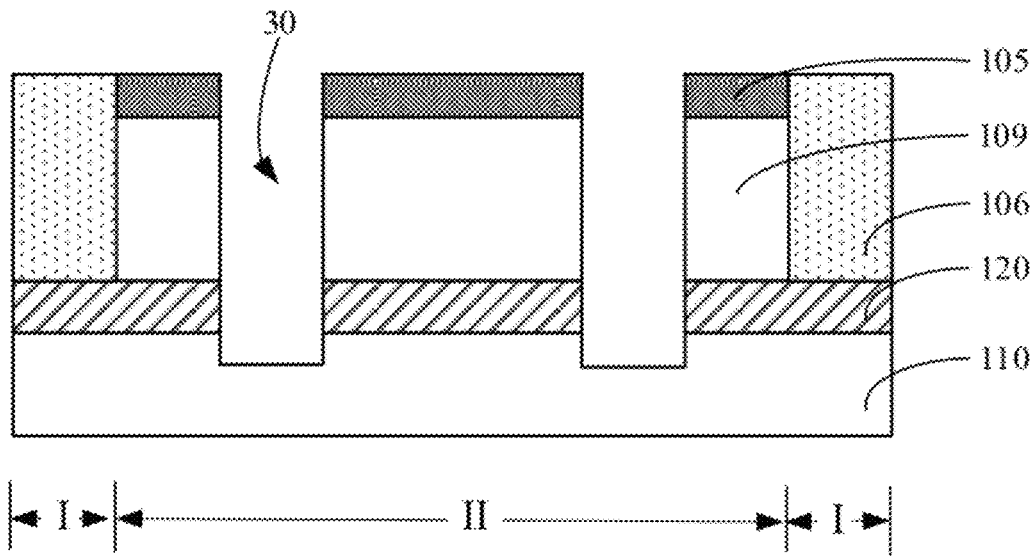

Reference is made to FIG. 30 and FIG. 31. FIG. 31 is a schematic transverse cross-sectional view of FIG. 30 taken along an X-direction. In some embodiments, the base 100 includes a connection area I and a structure area II. The first sacrificial layer 109 and the second isolation layer 105 are formed on the base 100 in the structure area II, and a peripheral insulation structure 106 is formed on the base 100 in the connection area I. The second isolation layer 105, the first sacrificial layer 109 and the first isolation layer 120 are patterned to form a first via 30 penetrating through the second isolation layer 105, the first sacrificial layer 109 and the first isolation layer 120.

The manner of patterning includes but is not limited to the following operations. A mask layer is formed on the first sacrificial layer 109, and then a process of patterning the above-mentioned semiconductor structure is performed based on the formed mask layer. In addition, there may be one first via 30 or multiple first vias 30 formed by patterning, and the multiple first vias are provided on the base 100 and spaced apart from each other. With reference to FIG. 30, in this embodiment, an example in which four first vias 30 are formed by patterning is described in detail, which does not limit the disclosure. In other embodiments, there may be one, three or five first vias formed by patterning, and in specific applications, the number of the first vias 30 formed by patterning may be specifically set according to requirements. In addition, in the embodiments of the disclosure, the four first vias are arranged in a quadrangular arrangement.

Figure 32:
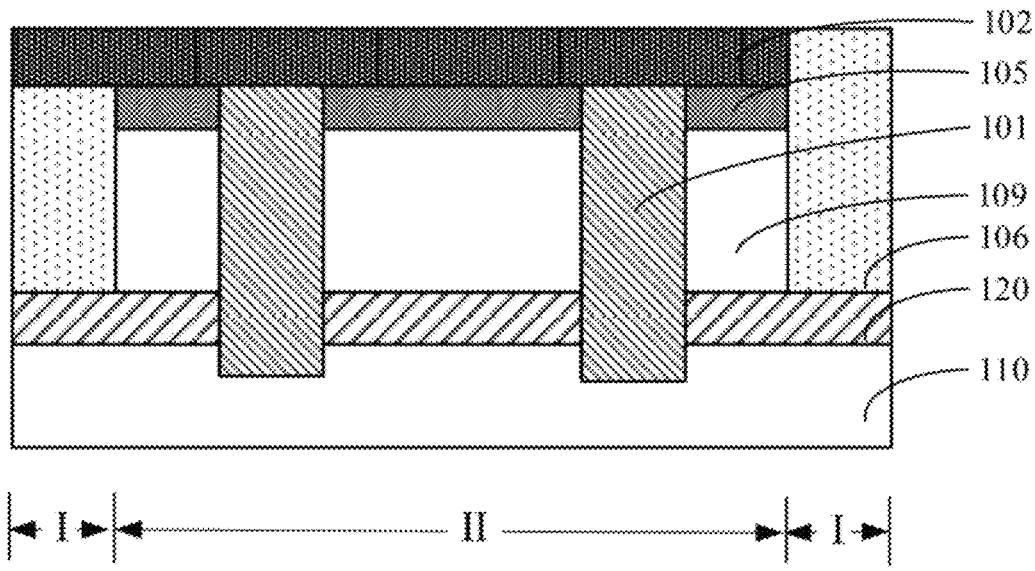

In some embodiments, with reference to FIG. 32, a base conductive layer filling the first via 30 (with reference to FIG. 31) and covering a top surface of the second isolation layer 105 is formed. The base conductive layer extends into the peripheral insulation structure 106 in the connection area I. The base conductive layer filling the first via 30 serves as a first conductive path 101, and the base conductive layer located on a top surface of the first conductive path 101 and the top surface of the second isolation layer 105 serves as the second electrical connection structure 102.

Specifically, a base conductive layer is formed on the basis of the first electrical connection structure 110 through an epitaxial growth process. The doping concentration of group VA elements in a part of the base conductive layer serving as the first conductive path 101 is greater than the doping concentration in the middle of the base conductive layer serving as the first conductive path 101, to form a first doped area and a second doped area. A part of the base conductive layer serving as the second electrical connection structure 102 may not be doped with group VA elements, or may be doped with elements other than group VA elements and group IIIA elements, such as a germanium element or a carbon element, to improve the conductive property of the second electrical connection structure 102.

In some embodiments, the first conductive path 101 includes a first channel area (not identified), a first doped area (not identified) and a second doped area (not identified). The first doped area is located at one end of the first channel area (not identified), and the second doped area is located at another end of the first channel area opposite to said one end. The second doped area is away from the first electrical connection structure 110.

Specifically, the first conductive path 101 is doped in situ, and the material of the first conductive path 101 is an N-type semiconductor material which is formed by doping group VA elements into monocrystalline silicon. In this embodiment, an example in which the second doped area is away from the first electrical connection structure 110 and the first doped area is close to the first electrical connection structure 110 is described in detail, which does not limit the disclosure. In other embodiments, the first conductive path may be formed by deposition followed by doping.

Figure 33:
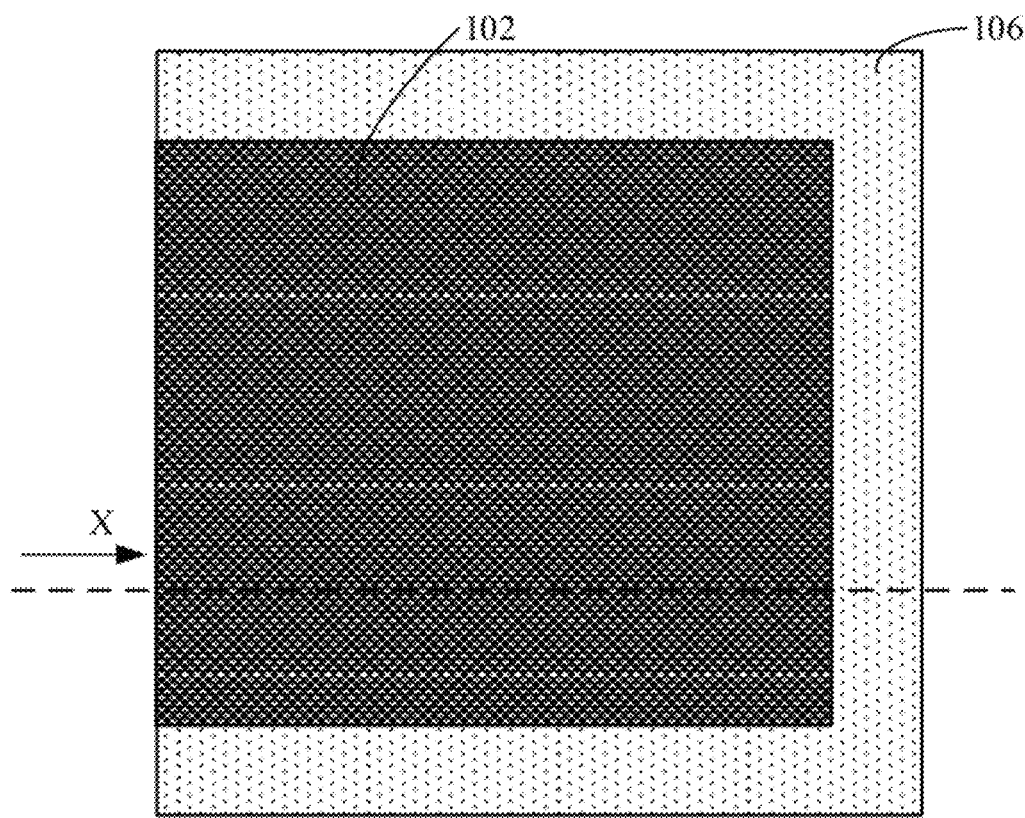

In this embodiment, reference is made to FIG. 32 and FIG. 33. FIG. 32 is a schematic transverse cross-sectional view of FIG. 33 taken along an X-direction. The second electrical connection structure 102 is a second conductive layer that is a full-face continuous film layer. In other embodiments, the second electrical connection structure includes second wire layers extending in a second direction.

In some embodiments, if the second electrical connection structure 102 is formed on the top surface of the second isolation layer 105, with reference to FIG. 33, the second electrical connection structure 102 is formed on the first sacrificial layer 109.

Specifically, the base 100 includes a connection area I and a structure area II. The first sacrificial layer 109 and the second electrical connection structure 102 are formed on the base 100 in the structure area II, and the peripheral insulation structure 106 is formed on the base 100 in the connection area I.

Figure 34:
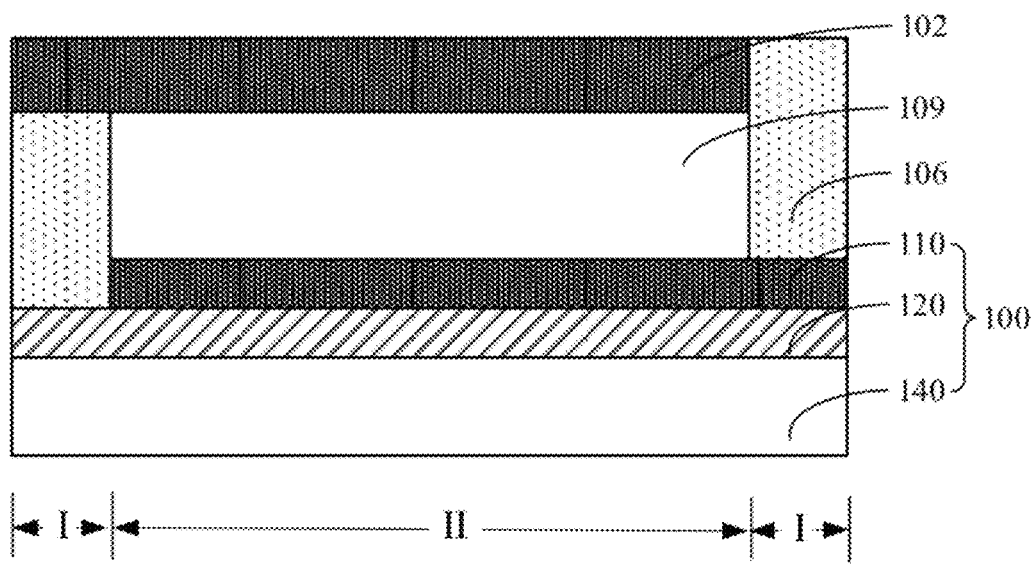

In some embodiments, with reference to FIG. 34, the first electrical connection structure 110 is a first conductive layer, the second electrical connection structure is a second conductive layer, and each of the first conductive layer and the second conductive layer is a full-face continuous film layer. As such, the first conductive layer extends into the peripheral insulation structure 106 on a first side of the connection area I and the second conductive layer extends into the peripheral insulation structure 106 on a second side of the connection area I, and the first side and the second side of the connection area I are located on different sides of the structure area II. The extension direction of the first conductive layer is different from the extension direction of the second conductive layer, thereby enabling to derive electrical signals of the first conductive layer and the second conductive layer in the connection area I on different sides of the structure area II, thereby further reducing the layout area of the semiconductor structure in the direction of the surface of the base 100. In other embodiments, the second electrical connection structure may also be second wire layers extending in a second direction.

Figure 35:
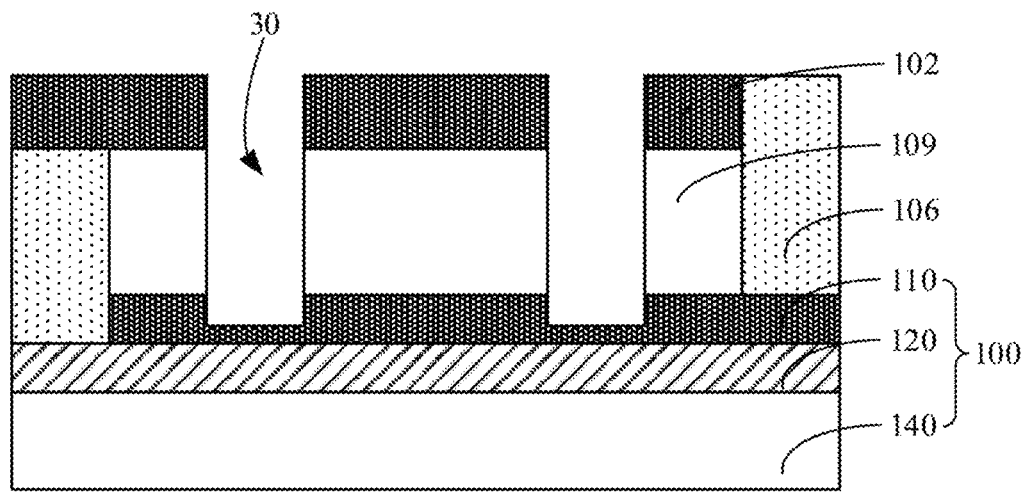

In some embodiments, with reference to FIG. 35, the second electrical connection structure 102, the first sacrificial layer 109 and a portion of the first electrical connection structure 110 are patterned to form a first via 30 penetrating through the second electrical connection structure 102, the first sacrificial layer 109 and the portion of the first electrical connection structure 110.

The manner of patterning includes but is not limited to the following operations. A mask layer is formed on the second electrical connection structure 102, and then a process of patterning the above-mentioned semiconductor structure is performed based on the formed mask layer. In addition, there may be one first via 30 or multiple first vias 30 formed by patterning, and multiple first vias are provided on the base 100 and spaced apart from each other.

Figure 36:
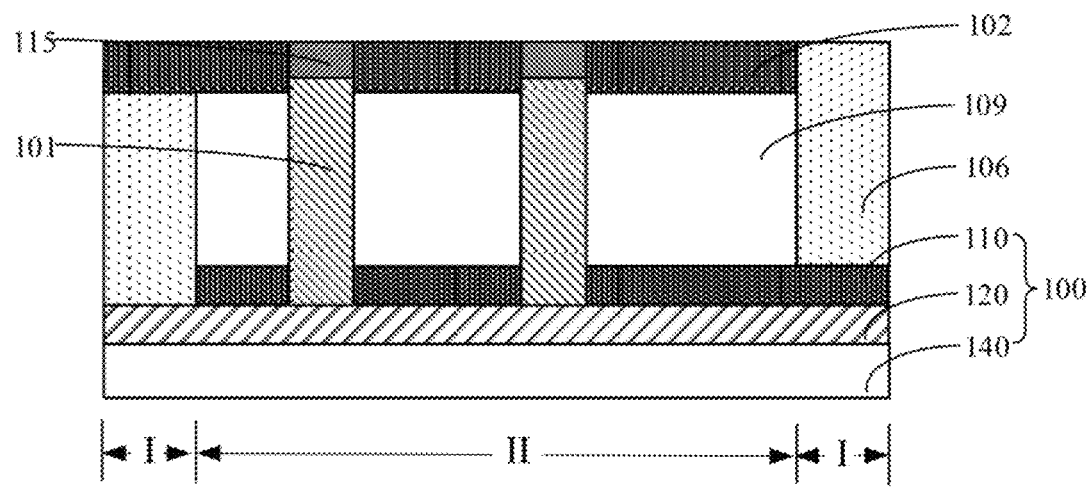

In some embodiments, with reference to FIG. 36, a first conductive path 101 filling a portion of the first via 30 (with reference to FIG. 34) is formed. A top surface of the first conductive path 101 is located higher than a bottom surface of the second electrical connection structure 102 and located lower than a top surface of the second electrical connection structure 102 in a direction perpendicular to a surface of the base 100. A passivation layer 115 is formed in the second electrical connection structure 102 and in a gap formed by the second electrical connection structure 102 and the first conductive path 101.

Specifically, after the gate structure is subsequently formed, the passivation layer 115 is located between the first conductive path 101 and the gate structure, thereby prevent the contact between the top surface of the first conductive path 101 and the gate structure, which facilitates reducing electrical interference between the first conductive path 101 and the gate structure.

Figure 37:
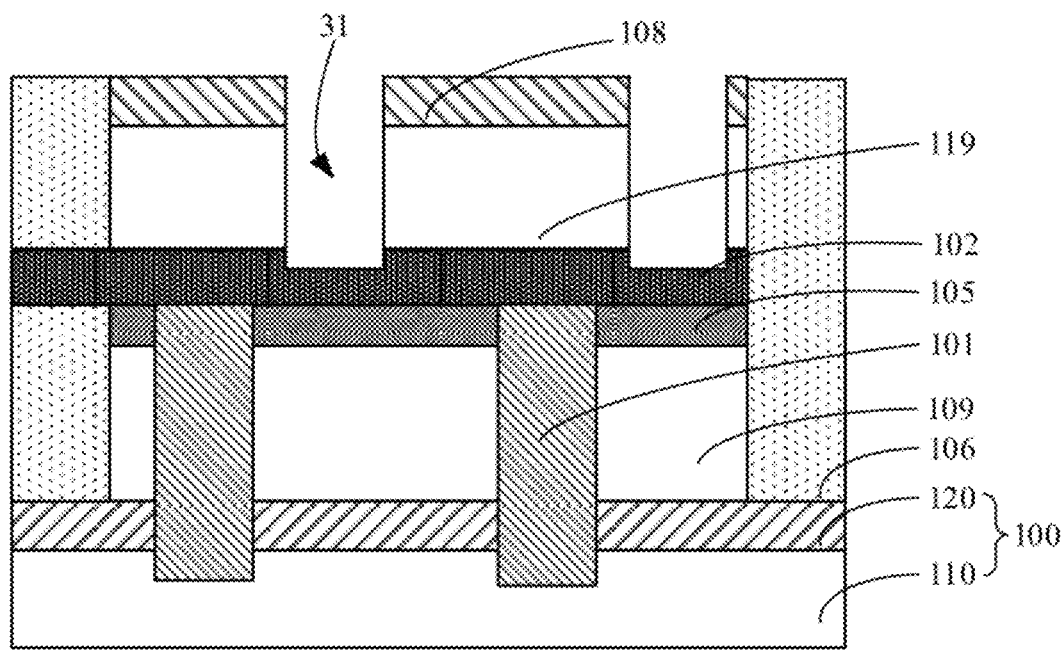
Figure 38:
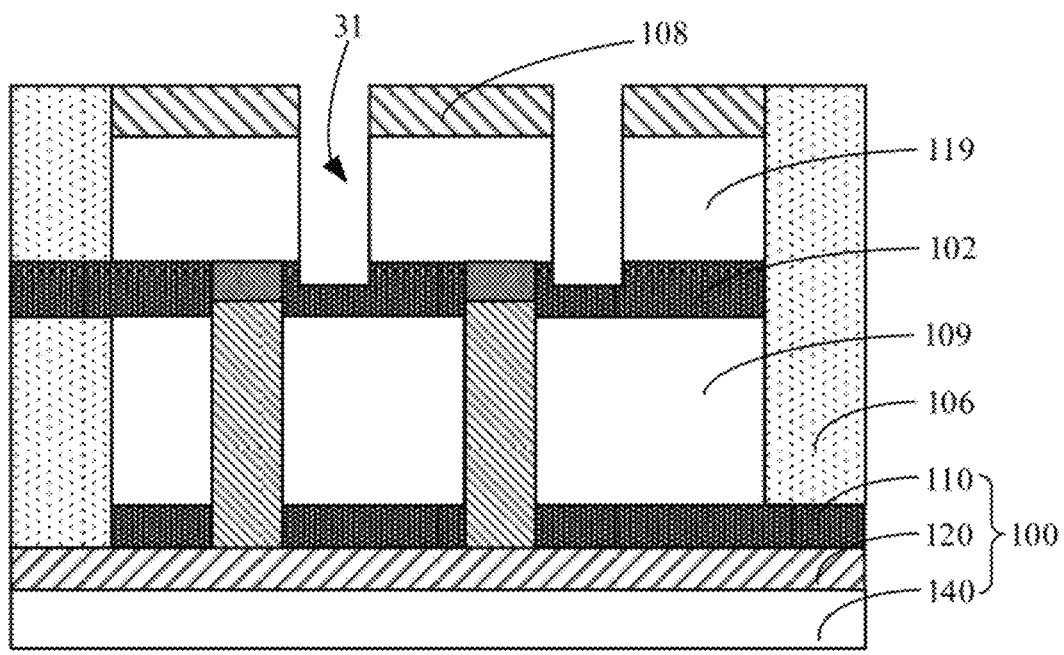

In the embodiments of the disclosure, with reference to FIG. 37 or FIG. 38, a second sacrificial layer 119 and a protective layer 108 are successively formed on a side of the second electrical connection structure 102 away from the base 100.

In the embodiments of the disclosure, the second sacrificial layer 119 is formed by means of spin coating, and the second sacrificial layer 119 may be deposited with a high deposition rate by means of spin coating, such that the second sacrificial layer 119 with a large thickness may be deposited in a relatively short time. In addition, the second sacrificial layer 119 is formed of a semiconductor material containing carbon or oxygen, and the second sacrificial layer may be subsequently removed by ashing or dry etching without affecting other structures. In addition, the material of the protective layer 108 is silicon nitride.

In some embodiments, with continuous reference to FIG. 37 or FIG. 38, the protective layer 108 and the second sacrificial layer 119 are patterned to form a second via 31 penetrating through the protective layer 108 and the second sacrificial layer 119. One of an orthographic projection of the first via 30 (with reference to FIG. 34) on the base 100 and an orthographic projection of the second via 31 on the base 100 includes an area which at least does not partially overlap with another of the orthographic projection of the first via 30 on the base 100 and the orthographic projection of the second via 31 on the base 100, such that one of an orthographic projection of the second conductive path formed subsequently in the second via 31 on the base 100 and an orthographic projection of the first conductive path 101 on the base 100 includes an area which at least does not partially overlap with another of the orthographic projection of the second conductive path formed subsequently in the second via 31 on the base 100 and the orthographic projection of the first conductive path 101 on the base 100.

In this embodiment, a portion of the second electrical connection structure 102 is also patterned to increase the surface area of the second electrical connection structure 102 exposed by the second via 31.

The manner of patterning includes but is not limited to the following operations. A mask layer is formed on the protective layer 108, and then a process of patterning the above-mentioned semiconductor structure is performed based on the formed mask layer. In addition, there may be one second via 31 or multiple second vias 31 formed by patterning, and multiple second vias are provided on the base 100 and spaced apart from each other.

Figure 39:
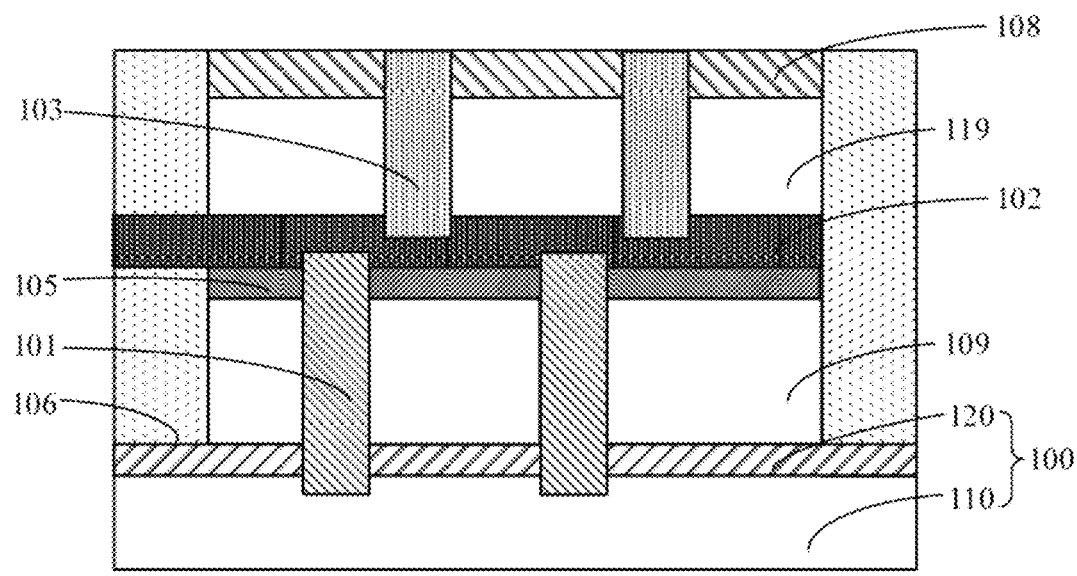
Figure 40:
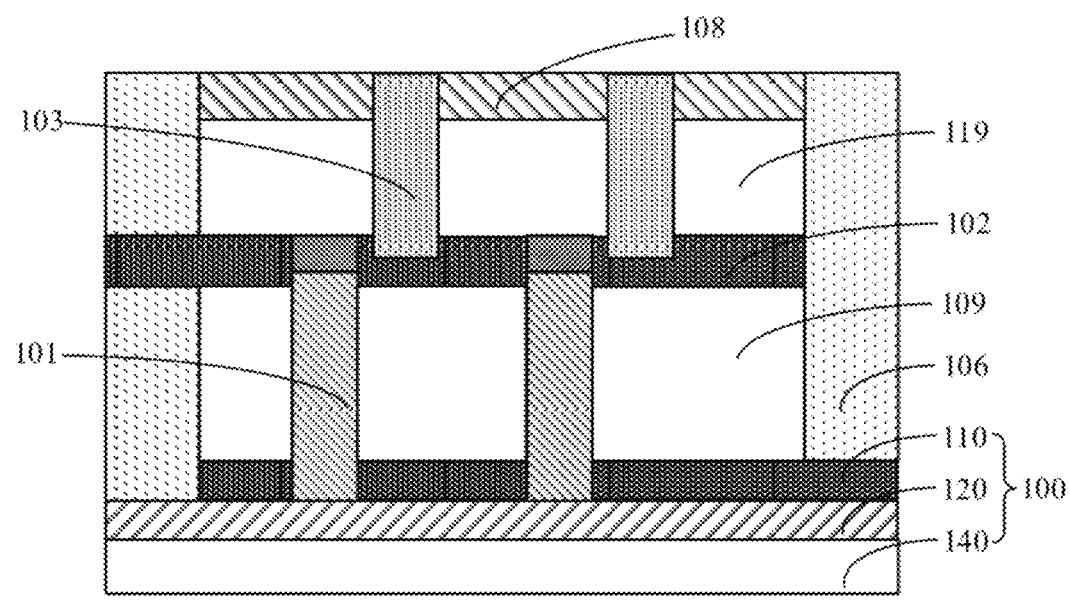

With reference to FIG. 39 or FIG. 40, in some embodiments, a second conductive path 103 filling the second via 31 is formed.

Specifically, the second conductive path 103 is formed by in-situ doping or by deposition followed by doping, and the material of the second conductive path 103 is a P-type semiconductor material which is formed by doping group IIIA elements into monocrystalline silicon. The doping concentration at two ends of the second conductive path 103 is greater than the doping concentration in the middle of the second conductive path, to form a third doped area (not identified) and a fourth doped area (not identified). In this embodiment, an example in which the fourth doped area is away from the base 100 and the third doped area is close to the second electrical connection structure 102 is described in detail, which does not limit this embodiment. In other embodiments, there may be an example in which the third doped area is away from the base and the fourth doped area is close to the second electrical connection structure.

It is to be noted that in some embodiments, one of the first conductive path 101 and the second conductive path 103 is an N-type conductive path and the other of the first conductive path and the second conductive path 103 is a P-type conductive path. In this embodiment, an example in which the first conductive path 101 is an N-type conductive path and the second conductive path 103 is a P-type conductive path is described in detail, which does not limit the disclosure. In other embodiments, an example in which the first conductive path is a P-type conductive path and the second conductive path is an N-type conductive path is described in detail.

Figure 41:
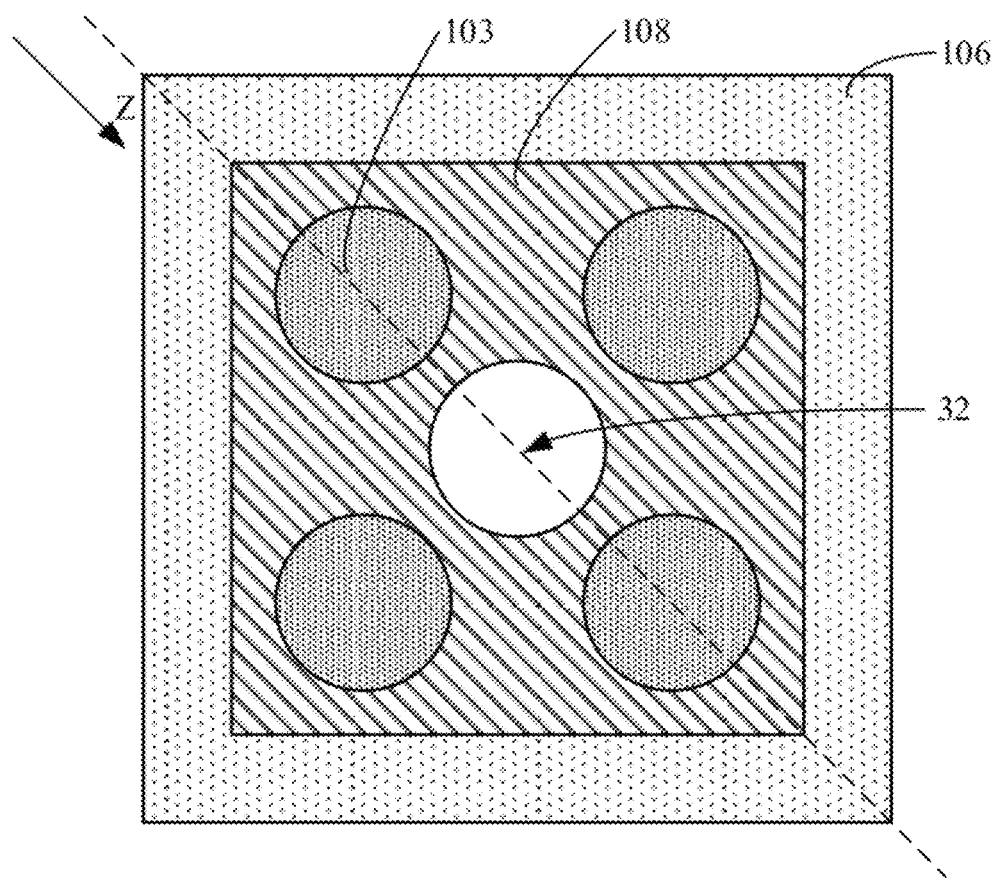
Figure 42:
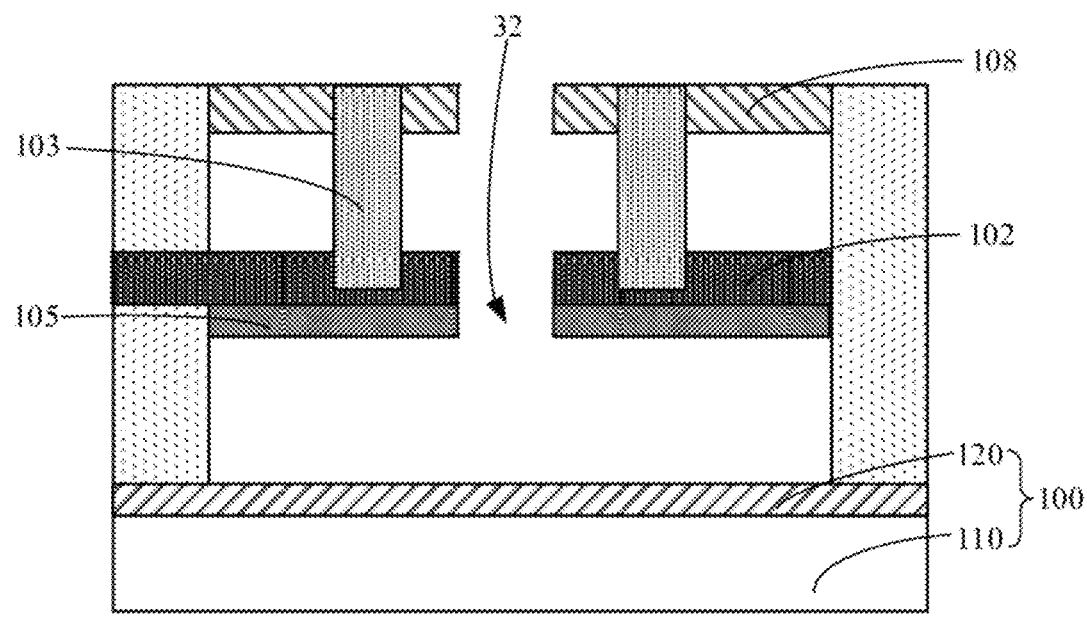
Figure 43:
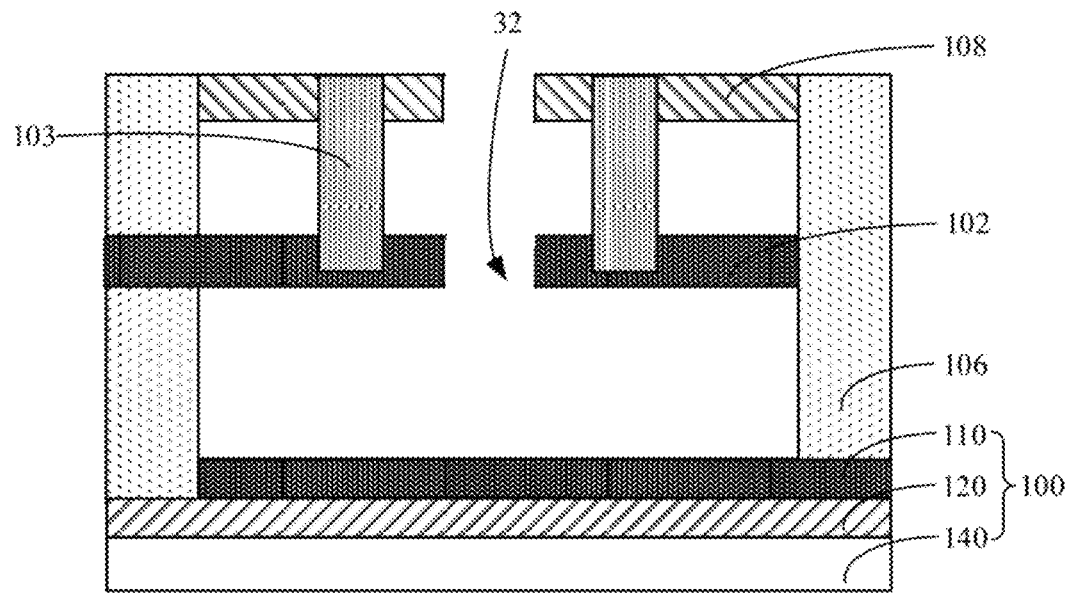

In some embodiments, reference is made to FIG. 41 to FIG. 43. FIG. 42 and FIG. 43 are two schematic oblique cross-sectional view of FIG. 41 taken along a Z-direction. The protective layer 108 is patterned to form a third via 32 until the first sacrificial layer 109 is exposed, and the second sacrificial layer 119 and the first sacrificial layer 109 are removed.

The manner of patterning the protective layer 108 includes but is not limited to the following operations. A mask layer is formed on the protective layer 108, and then a process of patterning the above-mentioned semiconductor structure is performed based on the formed mask layer.

In the embodiments of the disclosure, the second sacrificial layer 119 and the first sacrificial layer 109 are removed by means of wet etching, and it would have been clear to those skilled in the art that etching which is performed for a certain semiconductor material by means of wet etching does not affect other semiconductor structures. In addition, in other embodiments, the first sacrificial layer and the second sacrificial layer may be removed by ashing, and the first sacrificial layer and the second sacrificial layer may be removed with a higher rate by an ashing process without affecting other semiconductor structures.

Figure 44:
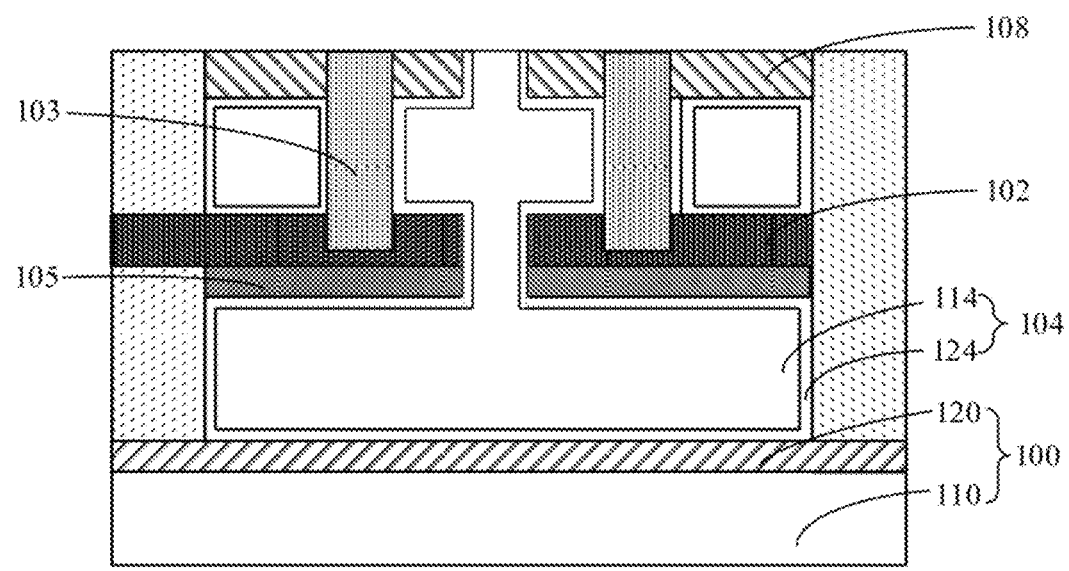
Figure 45:
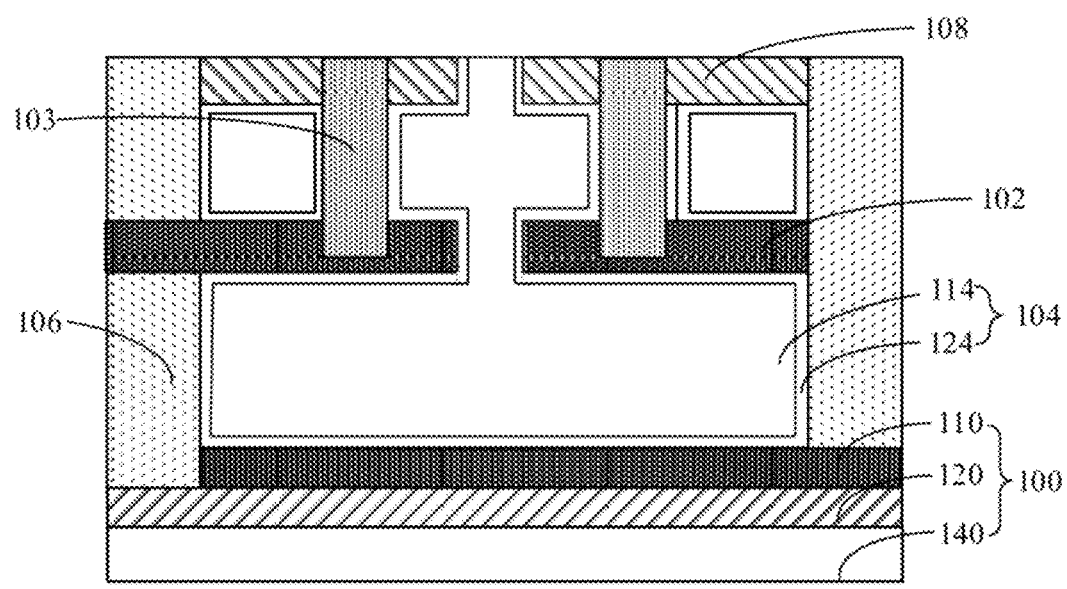

With reference to FIG. 44 or FIG. 45, a gate structure 104 filling gaps is formed.

Specifically, the gate structure 104 includes a gate oxide layer 124 and a metal gate layer 114. With reference to FIG. 43, the gate oxide layer 124 covers a side wall of the first channel area, a side wall of the second channel area, a side wall of the second electrical connection structure 102, a side wall of the second isolation layer 105, and a side wall of the first isolation layer 120. Alternatively, with reference to FIG. 44, the gate oxide layer 124 covers a side wall of the first channel area, a side wall of the second channel area, a side wall of the second electrical connection structure 102, and a side wall of the first electrical connection structure 110. In addition, the metal gate layer 114 is filled in the gaps formed by the gate oxide layer 124, to form the gate structure 104.

In other embodiments, in order to prevent the problem of electrical interference between the first electrical connection structure and the gate structure and between the second electrical connection structure and the gate structure, the operation that the above-mentioned semiconductor structure is formed further includes the following operations. A first barrier layer (not shown) located between the first electrical connection structure and the gate structure is formed; and a second barrier layer (not shown) located between the second electrical connection structure and the gate structure is formed.

In some embodiments, with reference to FIG. 1 to FIG. 3 (the first electrical connection structure is located in the substrate) or with reference to FIG. 14 and FIG. 15 (the first electrical connection structure is located on the first isolation layer), a first conductive plug 107 electrically connected to the first electrical connection structure 110, a second conductive plug 127 electrically connected to the second electrical connection structure 102, a third conductive plug 137 electrically connected to the fourth doped area, and a fourth conductive plug 147 electrically connected to the gate structure 104 are formed.

Specifically, in some embodiments, if the first electrical connection structure 110 is formed in the substrate, with reference to FIG. 1 to FIG. 3, the first conductive plug 107 penetrates through the peripheral insulation structure 106 and the first isolation layer 120 and is electrically connected to the first electrical connection structure 110 in the substrate. In an exemplary embodiment, the first conductive plug 107 also penetrates through a portion of the first electrical connection structure 110 to increase the contact area between the first conductive plug 107 and the first electrical connection structure 110, thereby reducing the contact resistance between the first conductive plug 107 and the first electrical connection structure 110.

In some embodiments, if the first electrical connection structure 210 is formed on the first isolation layer 220, with reference to FIG. 14 and FIG. 15, the first conductive plug 207 penetrates through the peripheral insulation structure 206 and is electrically connected to the first electrical connection structure 210. In an exemplary embodiment, the first conductive plug 207 also penetrates through a portion of the first electrical connection structure 210 to increase the contact area between the first conductive plug 207 and the first electrical connection structure 210, thereby reducing the contact resistance between the first conductive plug 207 and the first electrical connection structure 210.

In some embodiments, with continued reference to FIG. 1 to FIG. 3, the second conductive plug 127 penetrates through a portion of the peripheral insulation structure 106 and is in contact with the second electrical connection structure 102. In an exemplary embodiment, the second conductive plug 127 also penetrates through a portion of the second electrical connection structure 102 to increase the contact area between the second conductive plug 127 and the second electrical connection structure 102, thereby reducing the contact resistance between the second conductive plug 127 and the second electrical connection structure 102.

In some embodiments, the third conductive plug 137 is in contact with the fourth doped area. In an exemplary embodiment, third conductive plugs 137 are arranged in one-to-one correspondence with the fourth doped areas, and each of the third conductive plugs 137 also penetrates through a portion of the respective one of the fourth doped areas to increase the contact area between each of the third conductive plugs 137 and the respective one of the fourth doped areas, thereby reducing the contact resistance between each of the third conductive plugs 137 and the respective one of the fourth doped areas. In this embodiment, there are four third conductive plugs 137. In other embodiments, the number of the third conductive plugs is set depending on the actual situation, as long as the number of the third conductive plugs corresponds to the number of the second conductive paths.

In some embodiments, the fourth conductive plug 147 is in contact with the top of the gate structure 104. In an exemplary embodiment, the fourth conductive plug 147 also penetrates through a portion of the gate structure 104. Specifically, the fourth conductive plug 147 penetrates through a portion of the metal gate layer 114 to increase the contact area between the fourth conductive plug 147 and the metal gate layer 114, thereby reducing the contact resistance between the fourth conductive plug 147 and the metal gate layer 114.

In summary, in the embodiments of the disclosure, a first conductive path 101 and a second conductive path 103 arranged vertically are formed, i.e., the first conductive path 101 and the second conductive path 103 in which in a first channel area and a second channel area misalign with each other and are stacked onto one another are formed, which facilitates saving layout space of a first conductive path 101 and a second conductive path 103 in the direction parallel to the surface of the base 100 while increasing the length of the first channel area and the length of the second channel area. In addition, one of an orthographic projection of the second conductive path 103 on the base 100 and an orthographic projection of the first conductive path 101 on the base 100 includes an area which at least does not partially overlap with another of the orthographic projection of the second conductive path 103 on the base 100 and the orthographic projection of the first conductive path 101 on the base 100, which facilitates preventing electrical interference between the first conductive path 101 and the second conductive path 103, thereby improving the electrical performance of the semiconductor structure.

The above various operation divisions are merely for clarity of description. During the implementation, the operations may be combined into one operation or some operations may be divided into multiple operations. The operations, including the same logical relationship, are all within the scope of protection of this patent. The addition of insignificant modifications to the process or the introduction of insignificant designs without changing the core design of the process falls within the scope of protection of this patent.

Since the above-mentioned embodiments correspond to this embodiment, this embodiment may be implemented in cooperation with the above-mentioned embodiments. The technical details mentioned in the above-mentioned embodiments are still valid in this embodiment, and the technical effects achieved in the above-mentioned embodiments may also be achieved in this embodiment. In order to reduce repetition, the description thereof will be omitted herein. Accordingly, the related technical details mentioned in this embodiment may also be applied to the above-mentioned embodiments.

It will be understood by those ordinarily skilled in the art that the above-mentioned various implementations are illustrative of specific embodiments of the disclosure, and that various changes in form and details may be made therein without departing from the spirit and scope of the disclosure. Various changes and modifications may be made by those skilled in the art without departing from the spirit and scope of the disclosure, and therefore the scope of protection of the disclosure is to be determined by the scope of the appended claims.

The invention claimed is:

1. A semiconductor structure, comprising:
   a base and at least one first conductive path located on the base, wherein the at least one first conductive path comprises, in a direction perpendicular to a surface of the base, a first channel area, a first doped area and a second doped area, wherein the first doped area is located at one end of the first channel area, and the second doped area is located at another end of the first channel area opposite to said one end;
   a first electrical connection structure located in the base, wherein the first electrical connection structure is in contact with the first doped area;
   a second electrical connection structure, wherein the second electrical connection structure is in contact with the second doped area, and a plane where the second electrical connection structure is located is parallel to a plane where the first electrical connection structure is located;
   at least one second conductive path, wherein the at least one second conductive path comprises, in the direction perpendicular to the surface of the base, a second channel area, a third doped area and a fourth doped area, the third doped area is located at one end of the second channel area, and the fourth doped area is located at another end of the second channel area opposite to said one end, the third doped area is in contact with a side of the second electrical connection structure away from the base, and one of an orthographic projection of the at least one second conductive path on the base and an orthographic projection of the at least one first conductive path on the base comprises an area which at least does not partially overlap with another of the orthographic projection of the at least one second conductive path on the base and the orthographic projection of the at least one first conductive path on the base; and
   a gate structure surrounding the first channel area and the second channel area.

2. The semiconductor structure according to claim 1, wherein at least two first conductive paths spaced apart from each other are disposed on the base, and second conductive paths arranged in one-to-one correspondence with the first conductive paths are disposed on the base, the first electrical connection structure is in contact with each of the first doped areas, and the second electrical connection structure is in contact with each of the second doped areas and each of the third doped areas.

3. The semiconductor structure according to claim 1, wherein in a direction from the first doped area to the second doped area, a top surface of the at least one first conductive path is located higher than a bottom surface of the second electrical connection structure and located lower than a top surface of the second electrical connection structure, and a bottom surface of the at least one second conductive path is located higher than the bottom surface of the second electrical connection structure and located lower than the top surface of the second electrical connection structure.

4. The semiconductor structure according to claim 1, wherein in a direction from the first doped area to the second doped area, the base comprises a substrate and a first isolation layer successively stacked onto one another, wherein the substrate comprises the first electrical connection structure, the first isolation layer is located on a top surface of the first electrical connection structure, and the at least one first conductive path penetrates through the first isolation layer such that the first doped area is in contact with the first electrical connection structure.

5. The semiconductor structure according to claim 4, wherein the first electrical connection structure is a first conductive layer, the first conductive layer is a full-face continuous film layer, and the first conductive layer is in contact with the first doped area.

6. The semiconductor structure according to claim 4, wherein the first electrical connection structure comprises at least one first wire layer extending in a first direction, and the at least one first wire layer is in contact with the first doped area arranged in the first direction.

7. The semiconductor structure according to claim 6, wherein the first electrical connection structure comprises at least two first wire layers spaced apart from each other.

8. The semiconductor structure according to claim 4, wherein the second electrical connection structure is a second conductive layer, the second conductive layer is a full-face continuous film layer, the second conductive layer is in contact with the second doped area and the third doped area, the second conductive layer is provided with a first communication hole penetrating through the second conductive layer, and the first communication hole is filled with the gate structure.

9. The semiconductor structure according to claim 4, wherein the second electrical connection structure comprises at least one second wire layer extending in a second direction, and the at least one second wire layer is in contact with the second doped area arranged in the second direction and the third doped area arranged in the second direction.

10. The semiconductor structure according to claim 9, wherein the second electrical connection structure comprises at least two second wire layers spaced apart from each other.

11. The semiconductor structure according to claim 4, further comprising: a second isolation layer surrounding the second doped area, wherein a top surface of the at least one first conductive path is located higher than a bottom surface of the second isolation layer in the direction from the first doped area to the second doped area.

12. The semiconductor structure according to claim 1, wherein in a direction from the first doped area to the second doped area, the base comprises a substrate, a first isolation layer and the first electrical connection structure successively stacked onto one another, and wherein the at least one first conductive path penetrates through at least a portion of the first electrical connection structure.

13. The semiconductor structure according to claim 12, wherein in the direction from the first doped area to the second doped area, the semiconductor structure further comprises a passivation layer located on a top surface of the at least one first conductive path, and the top surface of the at least one first conductive path is located higher than a bottom surface of the second electrical connection structure.

14. The semiconductor structure according to claim 1, wherein the base comprises: a structure area and a connection area, the connection area is arranged at a periphery of the structure area, and each first conductive path and each second conductive path is arranged in the structure area;
a peripheral insulation structure is arranged on the base in the connection area, and the first electrical connection structure and the second electrical connection structure extend into the peripheral insulation structure in the connection area;
the semiconductor structure further comprises: a first conductive plug and a second conductive plug;
the first conductive plug penetrates through the peripheral insulation structure and is in contact with the first electrical connection structure; and
the second conductive plug penetrates through a portion of the peripheral insulation structure and is in contact with the second electrical connection structure.

15. The semiconductor structure according to claim 14, further comprising: a third conductive plug in contact with the fourth doped area; and a fourth conductive plug in contact with a top of the gate structure.

16. The semiconductor structure according to claim 1, further comprising: a protective layer which is arranged around a top of the at least one second conductive path and in contact with the fourth doped area, wherein the protective layer is provided with a second communication hole penetrating through the protective layer in the direction perpendicular to the surface of a substrate, and the second communication hole is filled with the gate structure.

17. A method for forming a semiconductor structure, comprising:
providing a base, the base comprising a substrate, a first electrical connection structure and a first isolation layer;
forming a first sacrificial layer on the base;
patterning the first sacrificial layer and the first isolation layer to form a first via penetrating through the first sacrificial layer and the first isolation layer;
forming a first conductive path filling the first via and a second electrical connection structure located on a side of the first conductive path away from the base;
successively forming a second sacrificial layer and a protective layer on a side of the second electrical connection structure away from the base;
patterning the protective layer and the second sacrificial layer to form a second via penetrating through the protective layer and the second sacrificial layer, wherein one of an orthographic projection of the first via on the base and an orthographic projection of the second via on the base comprises an area which at least does not partially overlap with another of the orthographic projection of the first via on the base and the orthographic projection of the second via on the base;
forming a second conductive path filling the second via;

patterning the protective layer to form a third via until the first sacrificial layer is exposed, and removing the second sacrificial layer and the first sacrificial layer; and forming a gate structure filling gaps.

18. The method for forming the semiconductor structure according to claim 17, wherein providing the base comprises: providing a substrate, forming the first electrical connection structure in the substrate, and forming the first isolation layer on the substrate; and wherein after forming the first sacrificial layer, the method comprises: forming a second isolation layer on a side of the first sacrificial layer away from the base, wherein the first via penetrates through the second isolation layer.

19. The method for forming the semiconductor structure according to claim 17, wherein providing the base comprises: providing a substrate, forming the first isolation layer on the substrate, and forming the first electrical connection structure on the first isolation layer;

wherein after the second electrical connection structure is formed, a top surface of the first conductive path is located higher than a bottom surface of the second electrical connection structure and located lower than a top surface of the second electrical connection structure in a direction perpendicular to a surface of the base, and a passivation layer is formed in the second electrical connection structure and in a gap formed by the second electrical connection structure and the first conductive path.

* * * * *